(12) United States Patent
Etori et al.

(10) Patent No.: US 8,470,204 B2
(45) Date of Patent: Jun. 25, 2013

(54) PHTHALOCYANINE NANOWIRES, INK COMPOSITION AND ELECTRONIC ELEMENT EACH CONTAINING SAME, AND METHOD FOR PRODUCING PHTHALOCYANINE NANOWIRES

(75) Inventors: Hideki Etori, Chiba (JP); Hideyuki Murata, Chiba (JP); Norimasa Fukazawa, Chiba (JP); Shou Inagaki, Chiba (JP); Hiroshi Isozumi, Tokyo (JP); Masanori Kasai, Tokyo (JP)

(73) Assignee: DIC Corporation, Tokyo (JP)

( * ) Notice: Subject to any disclaimer, the term of this patent is extended or adjusted under 35 U.S.C. 154(b) by 0 days.

(21) Appl. No.: 13/265,594

(22) PCT Filed: Apr. 13, 2010

(86) PCT No.: PCT/JP2010/056579
§ 371 (c)(1),
(2), (4) Date: Jan. 6, 2012

(87) PCT Pub. No.: WO2010/122921
PCT Pub. Date: Oct. 28, 2010

(65) Prior Publication Data
US 2012/0104335 A1    May 3, 2012

(30) Foreign Application Priority Data

Apr. 23, 2009 (JP) .................. 2009-105174
Apr. 23, 2009 (JP) .................. 2009-105175
Sep. 4, 2009 (JP) .................. 2009-204633
Oct. 27, 2009 (JP) .................. 2009-246485

(51) Int. Cl.
| | |
|---|---|
| *H01B 1/12* | (2006.01) |
| *C09B 47/04* | (2006.01) |
| *B82B 1/00* | (2006.01) |
| *H01L 21/336* | (2006.01) |

(52) U.S. Cl.
USPC ....................... 252/500; 252/519.2

(58) Field of Classification Search
USPC ............... 252/500, 519.2, 519.21; 540/122, 540/128, 139
See application file for complete search history.

(56) References Cited

U.S. PATENT DOCUMENTS 5,248,336 A * 9/1993 Gerson et al. ............. 106/411
7,293,867 B2 * 11/2007 Ogawa et al. ............. 347/100
(Continued)

FOREIGN PATENT DOCUMENTS

| JP | 2002-121420 A | 4/2002 |
| JP | 2003-71799 A  | 3/2003 |

(Continued)

OTHER PUBLICATIONS

C. D. Dimitrakopoulos, et al., Organic Thin Film Transistors for Large Area Electronics, Advanced Materials, 2002, No. 14, pp. 99-117.

(Continued)

*Primary Examiner* — Mark Kopec
(74) *Attorney, Agent, or Firm* — McDermott Will & Emery LLP

(57) ABSTRACT

The present invention provides phthalocyanine nanowires having a minor diameter of 100 nm or less and a ratio (length/minor diameter) of length to minor diameter of 10 or more, an ink composition characterized by containing, as essential components, the phthalocyanine nanowires and an organic solvent, a film including the phthalocyanine nanowires, and an electronic element including a film. Since by using an ink composition containing the phthalocyanine nanowires of the present invention a phthalocyanine film can be formed by a wet process such as coating or printing, a break-proof, light-weight, low-cost electronic element can be provided on a flexible plastic substrate.

17 Claims, 10 Drawing Sheets

U.S. PATENT DOCUMENTS

| | | | |
|---|---|---|---|
| 7,341,944 B2 * | 3/2008 | Harutyunyan | 438/679 |
| 2002/0007056 A1 * | 1/2002 | Shimada et al. | 540/124 |
| 2005/0138804 A1 | 6/2005 | Hasegawa et al. | |
| 2007/0172582 A1 | 7/2007 | Mahoney et al. | |
| 2008/0182388 A1 | 7/2008 | Hasegawa et al. | |

FOREIGN PATENT DOCUMENTS

| | | |
|---|---|---|
| JP | 2004-67883 A | 3/2004 |
| JP | 2004-91560 A | 3/2004 |
| JP | 2005-145896 A | 6/2005 |
| JP | 2006-143680 A | 6/2006 |
| JP | 2007-991 A | 1/2007 |
| JP | 2007-5684 A | 1/2007 |
| JP | 2007-39561 A | 2/2007 |
| JP | 2007-519636 A | 7/2007 |
| JP | 2007-526881 A | 9/2007 |
| JP | 2008-303383 A | 12/2008 |
| JP | 2009-135237 A | 6/2009 |
| JP | 2009-526656 A | 7/2009 |
| JP | 2009-280531 A | 12/2009 |
| JP | 2010-253598 * | 11/2010 |
| JP | 2010-254784 A | 11/2010 |
| WO | 03/076332 A1 | 9/2003 |
| WO | 2007/089482 A2 | 8/2007 |

OTHER PUBLICATIONS

R. Zeis, et al., Single-crystal field-effect transistors based on copper phthalocyanine, Applied Physics Letters, 2005, No. 86, 22103.

* cited by examiner

PHTHALOCYANINE NANOWIRES, INK COMPOSITION AND ELECTRONIC ELEMENT EACH CONTAINING SAME, AND METHOD FOR PRODUCING PHTHALOCYANINE NANOWIRES

CROSS REFERENCE TO PRIOR APPLICATIONS

This application is a U.S. National Phase application under 35 U.S.C. § 371 of International Application No. PCT/JP2010/056579, filed on Apr. 13, 2010 and claims benefit of priority to Japanese Patent Application No. 2009-105174, filed on Apr. 23, 2009; Japanese Patent Application No. 2009-105175, filed on Apr. 23, 2009; Japanese Patent Application No. 2009-204633, filed on Sep. 4, 2009; and Japanese Patent Application No. 2009-246485, filed on Oct. 27, 2009. The International Application was published in Japanese on Oct. 28, 2010 as WO 2010/122921 A1 under PCT Article 21(2). The contents of the applications are hereby incorporated by reference.

TECHNICAL FIELD

The present invention relates to phthalocyanine nanowires and an ink composition and an electronic element each containing the same, and further relates to a method for producing the phthalocyanine nanowires.

BACKGROUND ART

In recent years, there has been demand for "break-proof, lightweight, low-cost information terminals" that anyone can use in any place. In order to realize this, it is desired to use soft materials having cost merit for transistors serving as key devices of information terminals. However, generally used inorganic materials such as silicon cannot satisfactorily meet the demand.

Under this situation, "organic transistors (OFET)" using organic materials as semiconductors of the transistors have attracted attention (refer to Non-Patent Literature 1). Such semiconductors (organic semiconductors) composed of organic materials are soft and capable of low-temperature treatment, and generally have high affinity for solvents. Therefore, the semiconductors have the merit of being capable of production on flexible plastic substrates at low cost using a wet process such as coating, printing, or the like, and are thus expected as electronic element materials necessary for realizing "break-proof, lightweight, low-cost information terminals".

Phthalocyanines such as phthalocyanine and phthalocyanine derivatives are typical organic semiconductors and are known to exhibit good transistor characteristics by controlling a higher-order structure, i.e., a molecular arrangement and assembly state (refer to Non-Patent Literature 2). However, the phthalocyanines have low solvent-solubility and thus have difficulty in producing elements by a wet process, and a dry process such as vacuum deposition or sputtering is generally used for electronic elements. Such a dry process is complicated and thus makes it difficult to provide low-cost electronic elements which are characteristic of organic semiconductors.

In order to resolve this problem, there is disclosed a technique of producing transistors by a wet process in which the phthalocyanine derivatives with solvent solubility increased by introducing a soluble substituent are used (refer to Patent Literature 1). However, this method cannot sufficiently arrange phthalocyanine molecules and cannot control a higher-order structure, thereby degrading transistor characteristics as compared with transistors produced by a dry process. In order to exhibit good semiconductor characteristics, it is important for phthalocyanine molecules to have a structure with dimensionality, i.e., a crystal structure, in which the molecules are arranged in a certain direction. In particular, a one-dimensional wire crystal is advantageous. In addition, the wire crystal preferably has the form of a nanowire having a wire diameter of µm or less, more preferably 100 nm or less, for application to electronic elements.

Phthalocyanine crystals are widely used as coloring agents for coating and printing inks, and there are many known techniques for controlling the size and shape of the crystals. For example, fine particles are formed by a solvent salt milling method of mixing a metal phthalocyanine with an inorganic salt and an organic solvent and finely grinding the mixture to form pigment fine particles (for example, Patent Literature 2), or a precipitation method of precipitating the metal phthalocyanine in a large amount of water after dissolving the metal phthalocyanine in sulfuric acid (for example, Patent Literature 3). However, phthalocyanine nanowire crystals cannot be produced by using these methods.

CITATION LIST

Patent Literature

Non Patent Literature 1: Advanced Materials, 2002, No. 14, P. 99

Non Patent Literature 2: Applied Physics Letters, 2005, No. 86, P. 22103

Patent Literature 1: Japanese Unexamined Patent Application Publication No. 2008-303383

Patent Literature 2: Japanese Unexamined Patent Application Publication No. 2002-121420

Patent Literature 3: Japanese Unexamined Patent Application Publication No. 2004-091560

SUMMARY OF INVENTION

Technical Problem

In view of the above, an object of the present invention is to provide wire-shaped crystals of phthalocyanine which is a typical organic semiconductor, particularly phthalocyanine nanowires having a nanosized thin-wire structure with a wire breadth (minor diameter) of 100 nm or less and a ratio (length/minor diameter) of wire length to minor diameter of 10 or more, and to provide an ink composition containing the phthalocyanine nanowires.

Also, an object of the invention is to provide a low-cost electronic element including a film formed by a wet process of coating or printing the ink composition containing the phthalocyanine nanowires.

Solution to Problem

In order to resolve the above-mentioned problem, the present invention provides phthalocyanine nanowires having a minor diameter of 100 nm or less and a ratio (length/minor diameter) of length to minor diameter of 10 or more, and provides an ink composition characterized by containing the phthalocyanine nanowires and an organic solvent as essential components.

Also, the present invention provides a film characterized by containing the phthalocyanine nanowires.

Further, the present invention provides an electronic element characterized by containing the film.

Further, the present invention provides a method for producing phthalocyanine nanowires used for the ink composition, the film, and the electronic element.

Advantageous Effects of Invention

According to the present invention, the present invention can provide nanosized wire-shaped crystals having excellent semiconductor characteristics, particularly phthalocyanine nanowires having a nanosized thin-wire structure having a wire breadth (minor diameter) of 100 nm or less and a ratio (length/minor diameter) of wire length to minor diameter of 10 or more. Also, the present invention can provide a breakproof, lightweight, low-cost electronic element on a flexible plastic substrate because using an ink composition containing the phthalocyanine nanowires a phthalocyanine semiconductor film can be formed by a wet process such as coating or printing.

DESCRIPTION OF EMBODIMENTS

Figure 1:
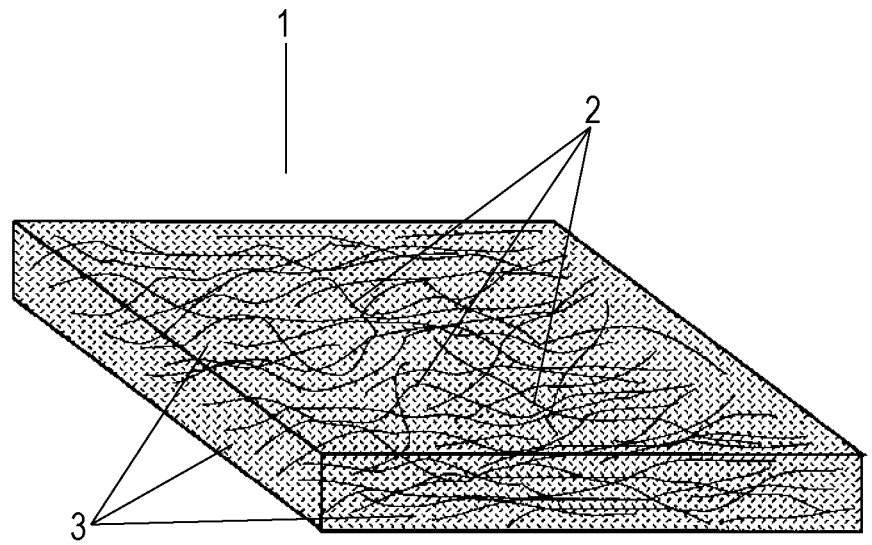
FIG. 1 is a schematic view of a film according to the present invention.

That is, the present invention provides:

1. phthalocyanine nanowires containing phthalocyanine and a phthalocyanine derivative and characterized in that a minor diameter is 100 nm or less, and a ratio (length/minor diameter) of the length to the minor diameter is 10 or more;

2. an ink composition containing the phthalocyanine nanowires described in 1 and an organic solvent as essential components;

3. a film characterized by containing the phthalocyanine nanowires described in 1;

4. an electronic element characterized by including the film described in 3; and 5. a method for producing the phthalocyanine nanowires described in 1, the method being characterized by including:

(1) a step (a) of producing a complex by dissolving phthalocyanine and a phthalocyanine derivative in an acid and precipitating the phthalocyanine and the phthalocyanine derivative in a poor solvent;

(2) a step (b) of forming a size-reduced complex by reducing the size of the complex;

(3) a step (c) of forming a dispersion by dispersing the size-reduced complex in an organic solvent; and (4) a step (d) of forming nanowires by heating the dispersion.

(Phthalocyanine Contained in Phthalocyanine Nanowires)

In the present invention, well-known conventional phthalocyanine having a central metal atom can be used. The central metal atom is not limited as long as it constitutes the nanowires, but examples thereof include a copper atom, a zinc atom, a cobalt atom, a nickel atom, a tin atom, a lead atom, a magnesium atom, a silicon atom, an iron atom, titanyl (TiO), vanadyl (VO), aluminum chloride (AlCl), and the like. Among these, a copper atom, a zinc atom, and an iron atom are particularly preferred.

(Phthalocyanine Derivative Contained in Phthalocyanine Nanowires)

The phthalocyanine nanowires of the present invention are phthalocyanine nanowires containing the phthalocyanine and a phthalocyanine derivative of general formula (1) or (2) below.

[Chem. 1]

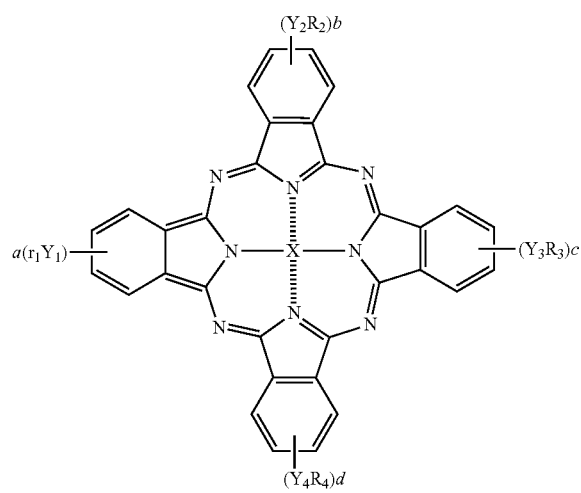

(1)

-continued (2)

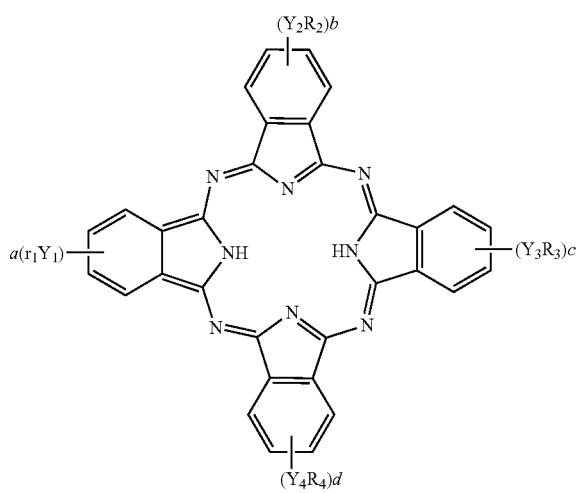

(In the formula, X is any one selected from the group consisting of a copper atom, a zinc atom, a cobalt atom, a nickel atom, a tin atom, a lead atom, a magnesium atom, a silicon atom, and an iron atom, and $Y_1$ to $Y_4$ represent bond groups which bond a phthalocyanine skeleton and $R_1$ to $R_4$, respectively;

when $Y_1$ to $Y_4$ are not present as bond groups, $R_1$ to $R_4$ each represent $SO_3H$, $CO_2H$, an alkyl group which may be substituted, an (oligo)aryl group which may be substituted, an (oligo)heteroaryl group which may be substituted, a phthalimide group which may be substituted, or a fullerene which may be substituted;

when $Y_1$ to $Y_4$ are each a bond group represented by $—(CH_2)_n—$ (n represents an integer of 1 to 10), $—CH=CH—$, $—O—$, $—NH—$, $—S—$, $—S(O)—$, or $—S(O)_2—$, $R_1$ to $R_4$ each represent an alkyl group which may be substituted, an (oligo)aryl group which may be substituted, an (oligo)heteroaryl group which may be substituted, a phthalimide group which may be substituted, or a fullerene which may be substituted; and a, b, c, and d each independently represent an integer of 0 to 2, but at least one of a, b, c, and d is 1.)

The metal atom X which forms a complex with the phthalocyanine of the present invention is not particularly limited as long as it is conventionally known as a central metal of metal phthalocyanine, but the metal atom is preferably any one selected from the metal atoms of copper, zinc, cobalt, nickel, tin, lead, magnesium, silicon, and iron. Also, metal phthalocyanine including titanyl (TiO), vanadyl (VO), or aluminum chloride (AlCl) coordinated as X may be used. In this case, a compound not containing the central metal X as in a phthalocyanine derivative represented by the general formula (2) can also be used as the phthalocyanine derivative of the present invention.

The bond groups of $Y_1$ to $Y_4$ are not particularly limited, and any bond groups can be used as long as they bond the phthalocyanine ring to $R_1$ to $R_4$. Examples of such bond groups include an alkylene group, an arylene group, a heteroarylene group, a vinylene group, an ethynylene group, a sulfide group, an ether group, a sulfoxide group, a sulfonyl group, a urea group, a urethane group, an amide group, an amino group, an imino group, a ketone group, an ester group, and the like. More specifically, $Y_1$ to $Y_4$ are each $—(CH_2)_n—$ (n represents an integer of 1 to 10), $—CH=CH—$, $—C≡C—$, $—O—$, $—NH—$, $—S—$, $—S(O)—$, or $—S(O)_2—$. In addition, a fullerene can also be used as a bond group of the present invention.

$R_1$ to $R_4$ are functional groups which can be bonded to the phthalocyanine ring through the bond groups $Y_1$ to $Y_4$, respectively. Examples of such functional groups include an alkyl group, an alkyloxy group, an amino group, a mercapto group, a carboxyl group, a sulfonic acid group, a silyl group, a silanol group, a boronic acid group, a nitro group, a phosphoric acid group, an aryl group, a heteroaryl group, a cycloalkyl group, a heterocycloalkyl group, a nitrile group, an isonitrile group, ammonium salts or fullerenes, a phthalimide group, and the like. More specific examples include aryl groups such as a phenyl group, a naphthyl group, and the like; heteroaryl groups such as an indoyl group, a pyridinyl group, and the like, and a Merrill group. Among these, preferred specific groups include $SO_3H$, $CO_2H$, an alkyl group, an alkyl group having an ether group or an amino group, an aryl group which may be substituted, a heteroaryl group which may be substituted, a phthalimide group which may be substituted, fullerenes which may be substituted, and the like.

As the alkyl group which may be substituted, an alkyl group having 1 to 20 carbon atoms can be used, and a lower alkyl group such as a methyl group, an ethyl group, a propyl group, or the like is particularly preferred. In addition, an alkyl group having an ether group or an amino group is also preferred, and, for example, a group represented by the following formula can be used.

[Chem. 2]

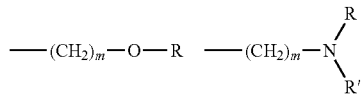

(wherein m represents an integer of 1 to 20, and R and R' each independently represent n alkyl group having 1 to 20 carbon atoms or an aryl group.)

As the (oligo)aryl group which may be substituted, a phenyl group which may be substituted, a naphthyl group which may be substituted, an oligophenylene group which may be substituted, or an oligonaphthyl group which may be substituted can be used. As a substituent, a usual known substituent with which an aryl group can be substituted can be used.

As the (oligo)heteroaryl group which may be substituted, a pyrrole group which may be substituted, a thiophene group which may be substituted, an oligopyrrole group which may be substituted, or an oligothiophene group which may be substituted can be preferably used. As a substituent, a usual known substituent with which a heteroaryl group can be substituted can be used.

In addition, as the fullerene which may be substituted, a fullerene having generally known substituent can be used, and, examples thereof include C60 fullerene, C70 fullerene, phenyl C61-butyric acid methyl ester [60]fullerene (PCBM), and the like.

Examples of the phthalimide group which may be substituted include groups represented by:

[Chem. 3]

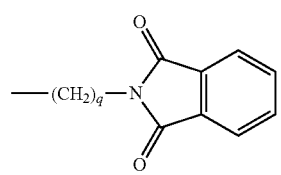

(wherein q is an integer of 1 to 20.) As a substituent, a usual known substituent with which a phthalimide group can be substituted can be used.

In addition, a, b, c, and d each independently represent an integer of 0 to 2 which indicates the number of substituents of each of $Y_1R_1$ to $Y_4R_4$ in the phthalocyanine ring. At least one of the numbers of substituents of the phthalocyanine ring is 1.

Examples of the phthalocyanine derivative represented by the general formula (1) of the present invention include, but are not limited to, the following.

[Chem. 4]

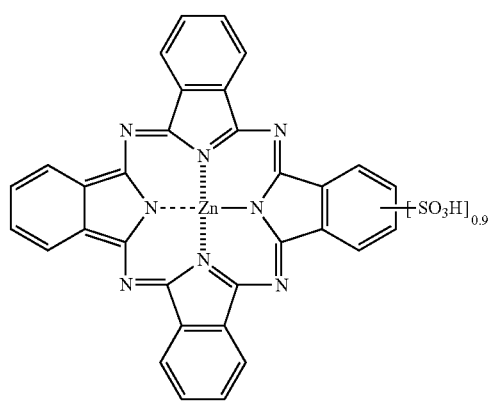

[Chem. 5]

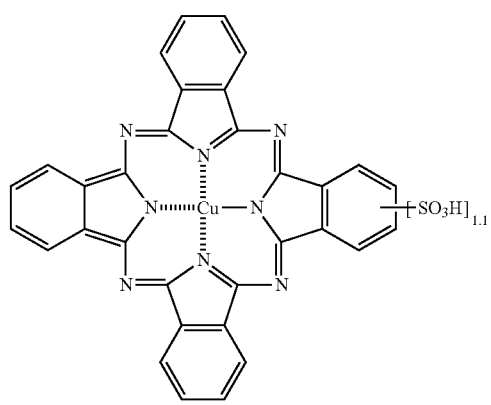

[Chem. 6]

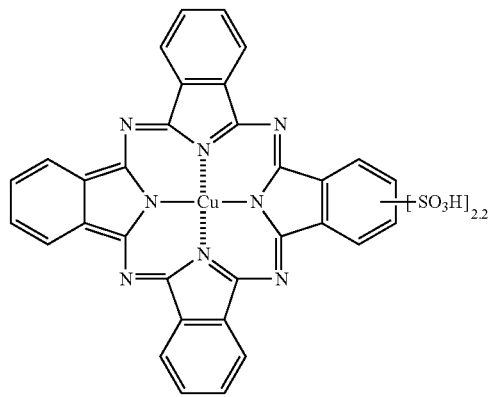

[Chem. 7]

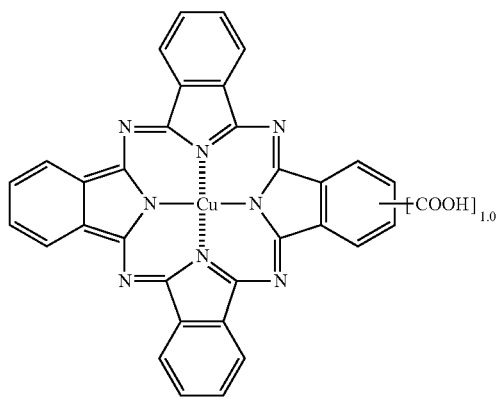

[Chem. 8]

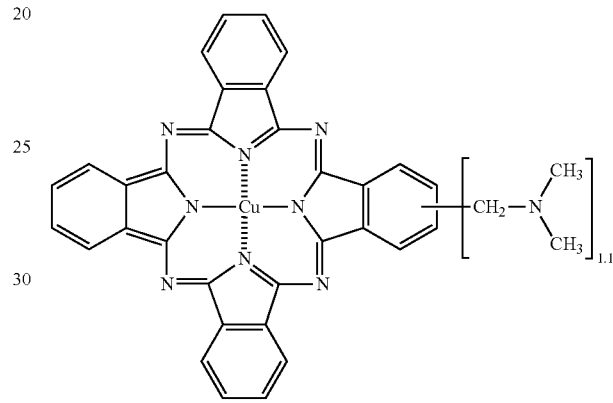

[Chem. 9]

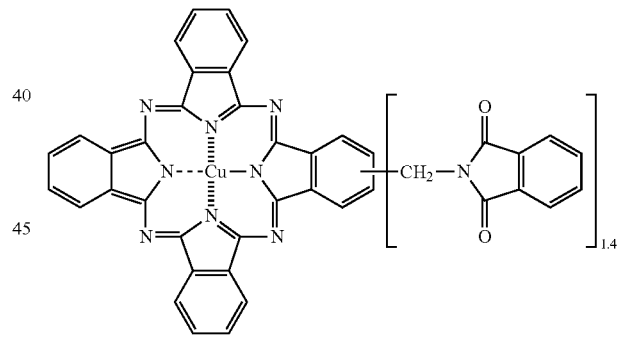

[Chem. 10]

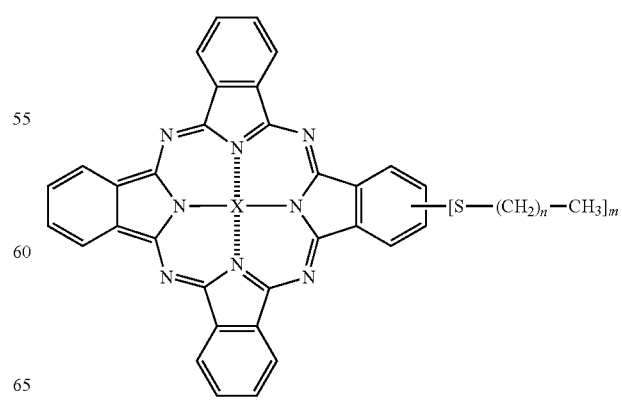

(wherein X represents a copper atom or a zinc atom, n represents an integer of 1 to 20, and m represents a number of 1 to 4 indicating an average number of functional groups introduced.)

[Chem. 11]

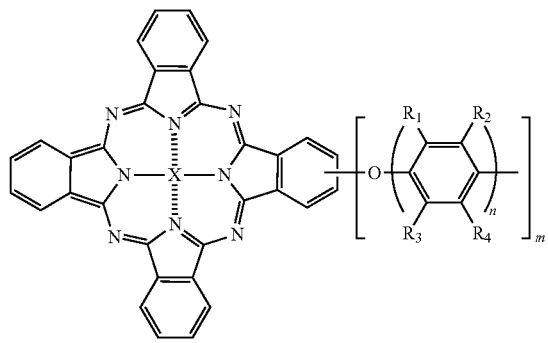

(wherein X represents a copper atom or a zinc atom, n represents an integer of 1 to 20, m represents a number of 1 to 4 indicating an average number of functional groups introduced, and $R_1$ to $R_4$ each independently represent a hydrogen atom, a halogen, an alkyl group having 1 to 20 carbon atoms, an alkyloxy group, or an alkylthio group.)

[Chem. 12]

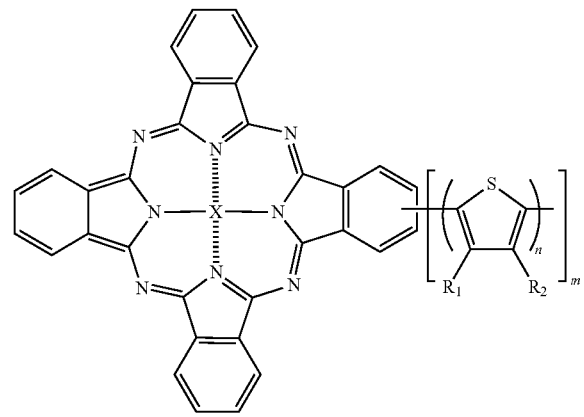

(wherein X represents a copper atom or a zinc atom, n represents an integer of 1 to 20, m represents a number of 1 to 4 indicating an average number of functional groups introduced, and $R_1$ and $R_2$ each independently represent a hydrogen atom, a halogen, an alkyl group having 1 to 20 carbon atoms, an alkyloxy group, or an alkylthio group.)

As a specific compound represented by the general formula (2), a phthalocyanine derivative without the central metal in each of the above formulae (4) to (12) can also be used.

Phthalocyanine derivatives represented by general formula (3) of the present invention includes compounds each containing a phthalocyanine ring substituted by at least one sulfamoyl group.

[Chem. 13]

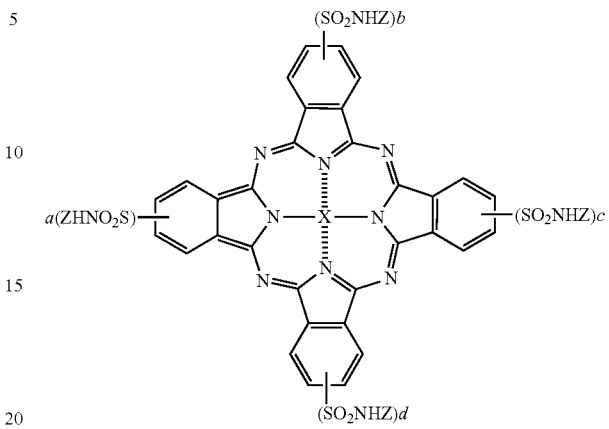

(In the formula, X represents any one selected from the group consisting of a copper atom, a zinc atom, a cobalt atom, a nickel atom, a tin atom, a lead atom, a magnesium atom, a silicon atom, and an iron atom, Z is a group represented by formula (a) or (b) described below, and a, b, c, and d each independently represent an integer of 0 to 2 but at least one of a, b, c, and d is 1.)

[Chem. 14]

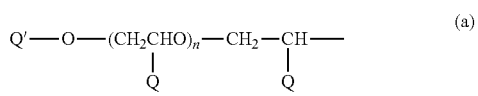

(wherein n is an integer of 4 to 100, Qs are each independently a hydrogen atom or a methyl group, and Q' is a noncyclic hydrocarbon group having 1 to 30 carbon atoms.)

[Chem. 15]

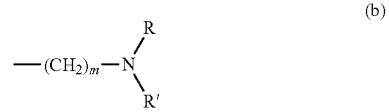

(wherein m is an integer of 1 to 20, and R and R' are each independently an alkyl group having 1 to 20 carbon atoms.)

The sulfamoyl group used is not particularly limited as long as the number of sulfamoyl groups introduced is at least 1 per phthalocyanine ring, but the number is preferably 1 or 2 and more preferably 1 per phthalocyanine ring. The substitution position is not particularly limited.

The molecular weight of the general formula (a) is not particularly limited, and any one of various functional groups such as an alkyl group and an ether group, an oligomer containing such a functional group having several repeat units, or a polymer having many repeat units may be used. In the case of a polymer, the number-average molecular weight is preferably 10,000 or less because phthalocyanine crystal growth is not inhibited by steric hindrance during the formation of nanowires, thereby producing sufficiently long nanowires. Examples of the polymer include a polymer composed of an alkyl group and a vinyl compound, a polymer having a urethane bond, an ester bond, and an ether bond, or the like.

The most preferred cyclic compound Z of the present invention is a polyalkylene oxide copolymer represented by the general formula (a), and any polyalkylene oxide such as ethylene oxide polymer or ethylene oxide/propylene oxide copolymer, which may be produced by block polymerization or random polymerization, can be used.

In this case, a noncyclic hydrocarbon group Q' having 1 to 30 carbon atoms may be a straight-chain hydrocarbon group or a branched hydrocarbon group, and the hydrocarbon group may be a saturated hydrocarbon group or an unsaturated hydrocarbon group. Examples of such a noncyclic hydrocarbon group include straight-chain or branched saturated hydrocarbon groups such as a methyl group, an ethyl group, a n-propyl group, an isopropyl group, a n-butyl group, an isobutyl group, a n-pentyl group, a n-hexyl group, a n-octyl group, a 2-ethyl-hexyl group, a n-dodecyl group, a stearyl group, a n-tetracosyl group, a n-triacontyl group, and the like.

other hand, the polyether monoamine as a raw material can be prepared by a known conventional method. For example, the polyether monoamine can be prepared by reductively aminating a hydroxyl group at an end of a polyether skeleton using a nickel/copper/chromium catalyst or by imidating a hydroxyl group at an end of a polyether skeleton by Mitsunobu reaction (reference: Synthesis, 1-28 (1981)) and then aminating the group by hydrazine reduction (reference: Chem. Commun., 2062-2063 (2003)).

The polyether monoamine is provided as a commercial product, for example, JEFFAMINE (trade name) M series of US Huntsman Corporation.

Examples of the phthalocyanine derivative used in the present invention and represented by the general formula (3) include, but are not limited to, compounds of a formula of [Chem. 16].

[Chem. 16]

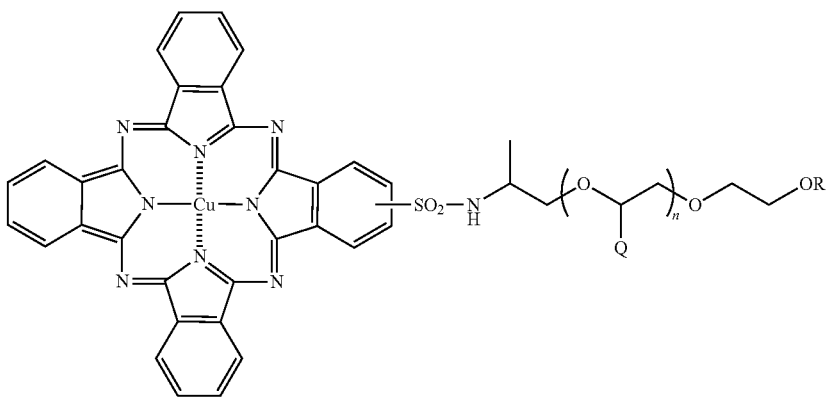

The straight-chain or branched unsaturated hydrocarbon group may be a hydrocarbon group having a double bond or a triple bond, and examples thereof include straight-chain or branched unsaturated hydrocarbon groups such as a vinyl group, a propenyl group, an isopropenyl group, a butenyl group, a pentenyl group, an isoprene group, a hexenyl group, a heptenyl group, an octenyl group, a decenyl group, a geranyl group, an ethynyl group, a 2-propynyl group, a 2-penten-4-ynyl group, and the like.

The number n of repetitions in a polyalkylene oxide portion is not particularly limited, but is preferably 4 or more and 100 or less, more preferably 5 or more and 80 or less, most preferably 10 or more and 50 or less, from the viewpoint of affinity to a dispersion solvent, i.e., dispersion stability of the resultant nanowires.

The phthalocyanine derivative used in the present invention and represented by the general formula (1) can be produced by combining known conventional methods, for example, reacting copper phthalocyanine sulfonyl chloride and polyether amine (hereinafter referred to as "polyether monoamine") having an amine at an end of a polyether main chain.

The copper phthalocyanine sulfonyl chloride as a raw material can be prepared by reaction between copper phthalocyanine and chlorosulfonic acid or thionyl chloride. On the (wherein in this formula, Q and R each represent a hydrogen atom or a methyl group, n represents an integer of 4 to 100, and the number of polyalkylene oxide chains bonded to phthalocyanine through sulfamoyl bonds is 0.2 to 3.0 for the four benzene rings possessed by phthalocyanine.)

Besides the above-described phthalocyanine derivatives, a phthalocyanine derivative having a group represented by the general formula (b) may be used the phthalocyanine derivative in the present invention.

This derivative may be produced by reaction with an amine represented by a formula below in stead of the polyetheramine used for introducing a group represented by the general formula (a).

[Chem. 17]

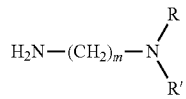

(wherein m represents an integer of 1 to 20, and R and R' each independently represent an alkyl group having 1 to 20 carbon atoms.)

R and R' are each preferably a lower alkyl group, particularly a methyl group, and m is preferably an integer of 1 to 6. Specific preferred phthalocyanine derivatives are represented by the following formula:

[Chem. 18]

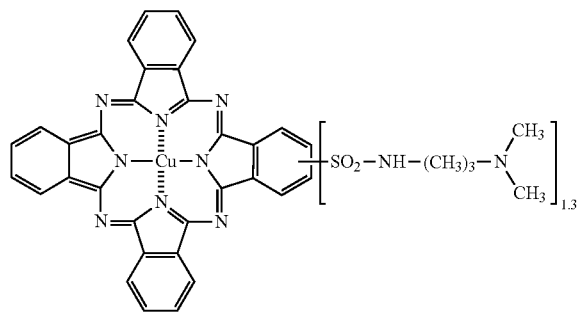

In the phthalocyanine derivative represented by the general formula (1), a group represented by each of $R_1$ to $R_4$ may be $SO_3H$ or $CO_2H$, and the number of $SO_3H$ or $CO_2H$ groups is not limited but is preferably 1 to 4, more preferably 1 to 2. Such groups may include one type of groups or two types of groups. $SO_3H$ or $CO_2H$ can be introduced by a well-known conventional method.

The number of sulfamoyl groups of the phthalocyanine derivative represented by the general formula (3) is not limited but is 1 to 4 and more preferably 1 to 2. Such groups may include one type of groups or two types of groups. The phthalocyanine derivative can be synthesized by a well-known conventional method.

In the above formula of phthalocyanine derivatives, a number added at the side of the parentheses denotes an average number of functional groups introduced per phthalocyanine molecule, and the number of functional groups introduced is preferably in a range of 0.2 to 3.0 and more preferably a range of 0.5 to 2.0 from the viewpoint of a nanowire forming mechanism described below.

Each of the various phthalocyanine derivatives can be synthesized by introducing a side chain or a functional group to a phthalocyanine ring. For example, a copper phthalocyanine sulfamoyl compound of [Chem. 16] can be synthesized by the above-described method, sulfonated copper phthalocyanines of [Chem. 4], [Chem. 5], and [Chem. 6] can be produced by heating copper phthalocyanine in fuming sulfuric acid (sulfur trioxide concentration: 20%), and a compound of [Chem. 9] can be synthesized by, for example, a method disclosed in Patent Literature (U.S. Pat. No. 2,761,868).

These phthalocyanine derivatives can also be produced by a well-known conventional method for synthesizing phthalocyanines described in Japanese Unexamined Patent Application Publication Nos. 2005-145896 and 2007-39561. For example, a phthalocyanine derivative having the functional group at a desired ratio can be synthesized by mixing a phthalonitrile compound, such as 4-phenoxy-phthalonitrile, 4-phenylthio-phthalonitrile, or 4-(1,3-benzothiazol-2-yl)-phthalonitrile, with ortho-phthalonitrile without a substituent at a desired ratio, and heating the mixture in ethylene glycol together with a metal salt such as copper(II) sulfate or zinc(II) chloride, in the presence of an organic base such as 1,8-diazabicyclo[5,4.0]undec-7-ene. In this case, the number of the functional groups of a phthalocyanine derivative which can be synthesized using the phthalonitrile compound as a raw material can be arbitrarily changed by changing the mixing ratio between the phthalonitrile compound and ortho-phthalonitrile. For example, when it is desired to synthesize a phthalocyanine derivative having one functional group per phthalocyanine molecule on average, the phthalocyanine derivative may be mixed with the ortho-phthalonitrile at 1:3, while when it is desired to introduce 1.5 functional groups on average, the mixing ratio may be 3:5. In this case, synthesis can be performed using the method described in the above patent literature. In addition, a phthalocyanine derivative having plural types of functional groups can be synthesized from two or more types of phthalonitrile compounds and ortho-phthalonitrile.

Beside the above-described phthalocyanine derivatives, phthalocyanine derivatives each further having a substituent include various well-known conventional phthalocyanine derivatives. Examples thereof include Chem. 2 described in paragraph [0001] of Japanese Unexamined Patent Application Publication No. 2007-519636 and Chem. 2 described in paragraph [0006] of Japanese Unexamined Patent Application Publication No. 2007-526881. Further, raw materials which can be used for synthesizing phthalocyanine derivatives in the present invention include a phthalonitrile derivative represented by Chem. 2 in paragraph [0014] of Japanese Unexamined Patent Application Publication No. 2006-143680 in which oligothiophenes are linked, and a phthalonitrile derivative represented by Chem. 9 in paragraph [0021] of Japanese Unexamined Patent Application Publication No. 2009-135237 in which fullerenes are linked.

The nanowires of the present invention are characterized in that various phthalocyanine nanowires having different lengths and minor diameters can be produced by mixing appropriate amounts of the phthalocyanine and the phthalocyanine derivative.

(Ink Composition)

An ink composition can be produced by dispersing, in an organic solvent, the phthalocyanine nanowires of the present invention, which have a minor diameter of 100 nm or less and a ratio (length/minor diameter) of length to minor diameter of 10 or more.

The type of the solvent used in the ink composition of the present invention is not particularly limited as long as the phthalocyanine nanowires are stably dispersed, and a single organic solvent or a mixture of two or more organic solvents may be used. However, from the viewpoint of good and stable dispersion of the phthalocyanine nanowires, an amide solvent is preferred. Specifically, N,N-dimethylacetamide, N,N-dimethylformamide, and N-methylpyrrolidone can be used, and N-methylpyrrolidone is particularly preferred.

In addition, the solvent constituting the ink composition can be appropriately selected according to the type of the phthalocyanine derivative contained in the phthalocyanine nanowires. Examples of a preferred organic solvent, besides the amide solvent, which can satisfactorily and stably disperse the phthalocyanine nanowires containing the derivative of [Chem. 9] include organic solvents such as aromatic solvents, e.g., toluene, xylene, and ethylbenzene; and halogenated aromatic organic solvents, e.g., chlorobenzene, dichlorobenzene, and the like.

Halogen organic solvents include organic solvents such as chloroform, methylene chloride, dichloroethane, and the like.

In the ink composition of the present invention, the content of the phthalocyanine nanowires in the ink composition is preferably 0.05 to 20% by mass, particularly preferably 0.1 to 10% by mass, in order to impart printability and form a good film.

In order to impart printability or coatability and impart film quality after printing or coating, a resin component can be added as a rheology adjusting or binder component to the ink composition of the present invention. The resin is not particularly limited as long as it is well-known conventional resin, and a single resin or combination of two or more resins may be used. However, polymethyl methacrylate, polystyrene, polycarbonate, polyvinylcarbazole, polythiophene, and polyphenylenevinylene are preferred.

When the content of such a resin is excessively high, the viscosity of ink is excessively increased, thereby influencing printability and film forming properties of coating. When an electrically inactive resin such as polymethyl methacrylate, polystyrene, or polycarbonate is used as the resin, at an excessively high content, the concentration of the phthalocyanine nanowires is decreased, thereby degrading the semiconductor characteristics exhibited by the material. Therefore, the content of the resin in the ink composition is preferably 20% by mass or less. Particularly, when an electrically inactive resin such as polymethyl methacrylate, polystyrene, or polycarbonate is used, the content is preferably 10% by mass or less.

Further, if required, a constitutional component and a surfactant mainly for adjusting surface tension of the ink and improving leveling properties can be added to the ink composition of the present invention.

As the constitutional component, one or two or more of known conventional single color pigments, single fine-particle powders, and pigment dispersions each containing the single color pigment or single fine-particle powder which is previously dispersed in a dispersant or an organic solvent can be used. Specific examples of such a component include, but are not limited to, EXCEDIC BLUE 0565, EXCEDIC RED 0759, EXCEDIC YELLOW 0599, EXCEDIC GREEN 0358, and EXCEDIC YELLOW 0648 (trade name, manufactured by DIC Corporation), Aerosil series (trade name, manufactured by Evonik Corporation), Sylysia, Sylophobic, Sylopute, Sylopage, Sylopure, Sylosphere, Sylomask, Silwell, and Fuji Balloon (trade name, manufactured by Fuji Silysia Chemical Ltd.), PMA-ST and IPA-ST (trade name, Nissan Chemical Industries, Ltd.), NANOBIC 3600 series and NANOBIC 3800 series (trade name, BYK Chemie). These may be used alone or in combination of two or more. In addition, the surface planarity of the film is required depending on the structure of an electronic element using the film. Therefore, the average particle diameter of the constitutional component added to the ink is preferably 1 to 150 nm and more preferably 5 to 50 nm. A fine particle silica dispersion and alumina dispersion such as PMA-ST and IPA-ST (trade name, Nissan Chemical Industries, Ltd.) and NANOBIC 3600 series (trade name, BYK Chemie) are preferred. The volume-average particle diameter can be easily measured by, for example, a dynamic light scattering method. The content of the constitutional component is 90% by mass or less, preferably 70% by mass or less, of the total solid content.

As the surfactant, a hydrocarbon surfactant, a silicon surfactant, a fluorine surfactant, and a mixture of two or more of these surfactants can be used. In particular, a preferred fluorine-based surfactant is a nonionic fluorine-based surfactant containing a linear-chain perfluoroalkyl group and a chain length of C6 or more, preferably C8 or more. Specific examples thereof include, but are not particularly limited to, Megafac F-482, Megafac F-470 (R-08), Megafac F-472SF, Megafac R-30, Megafac F-484, Megafac F-486, Megafac F-172D, and Megafac F178RM (trade name, manufactured by DIC Corporation). These surfactants may be used alone or in combination of two or more. The content of the surfactant is 5.0% by mass or less, preferably 1.0% by mass or less, of the total effective components in the ink composition.

(Formation of Film Containing Phthalocyanine Nanowires)

A film can be formed by printing or coating (wet process) the ink composition prepared as described above and then dried to form a film containing the phthalocyanine nanowires having a minor diameter of 100 nm or less and a ratio (length/minor diameter) of the length to the minor diameter of 10 or more.

A method for forming the film from the ink composition of the present invention is not particularly limited, and a known conventional method can be used. Specific examples thereof include an ink jet printing method, a gravure printing method, a gravure offset printing method, an offset printing method, a relief printing method, a letter press reverse printing method, a screen printing method, a micro contact printing method, a reverse method, an air doctor coater method, a blade coater method, an air knife coater method, a roll coater method, a squeeze coater method, an impregnated coater method, a transfer roll coater method, a kiss coater method, a cast coater method, a spray coater method, a die coater method, a spin coater method, a bar coater method, a slit coater method, and a drop cast method. When precise pattering is required, an ink jet printing method, a letter press reverse printing method, and a micro contact printing method are preferred.

FIG. 1 is a schematic view showing a film 1 formed as described above and containing the phthalocyanine nanowires which have a minor diameter of 100 nm or less and a ratio (length/minor diameter) of the length to the minor diameter of 10 or more. The film 1 can be formed using only the phthalocyanine nanowires 2 but preferably further contains a binder resin 3 for fixing and maintaining the phthalocyanine nanowires 2 and securing electric stability.

As described above, in the film 1, the binder resin 3 is not particularly limited as long as it is known conventional one, and a single resin or combination of two or more resins may be used. In particular, polymethyl methacrylate, polystyrene, polycarbonate, polyvinylcarbazole, polythiophene, or polyphenylenevinylene, or combination of these resins is preferably used.

In this case, when an electrically inactive resin such as polymethyl methacrylate, polystyrene, or polycarbonate is used as the binder resin 3 in the film 1, from the viewpoint of preventing a decrease in semiconductor characteristics exhibited by the phthalocyanine nanowires, the content is preferably 95% by mass or less and particularly preferably 40% by mass or less.

(Electronic Element Characterized by Including Film Containing Phthalocyanine Nanowires)

An example of an organic transistor (OFET) including a film composed of phthalocyanine nanowires which have a minor diameter of 100 nm or less and a ratio (length/minor diameter) of the length to the minor diameter of 10 or more or a film containing phthalocyanine nanowires (phthalocyanine nanowire film) is a top gate type in which a film is formed on a substrate using the ink composition of the present invention, a source electrode and a drain electrode are formed to be connected to the film on the substrate, a gate insulating film is formed, and finally a gate electrode is formed thereon through a gate insulating film.

The organic transistor may be a bottom gate type in which a gate electrode is first formed on a substrate, then a gate insulating film is formed and a film is formed using the ink composition of the present invention on the substrate through a gate insulating film and source and drain electrodes connected to the film are formed.

Figure 2:
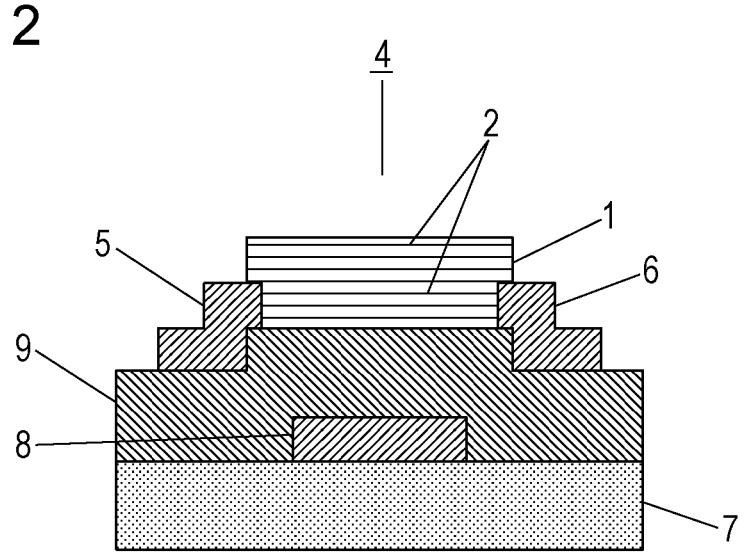
FIG. 2 is a schematic sectional view of a transistor serving as an electronic element according to the present invention.

FIG. 2 is a schematic view showing a bottom-gate/bottom-contact-type transistor 4 as an electronic element including a film (phthalocyanine nanowire film 1) containing phthalocyanine nanowires 2 which have a minor diameter of 100 nm or less and a ratio (length/minor diameter) of the length to the minor diameter of 10 or more. In this case, the thickness of the phthalocyanine nanowire film 1 can be appropriately determined to, for example, 50 to 10,000 nm. In addition, most of the phthalocyanine nanowires 2 in the phthalocyanine nanowire film 10 are preferably arranged in the length direction along a direction between a source electrode 5 and a drain electrode 6. In addition, the minor diameter of the phthalocyanine nanowires is preferably 10 nm to 100 nm and more preferably 20 to 100 nm because a current per unit electrode width can be increased. Further, the ratio (length/minor diameter) of the length to the minor diameter is preferably 40 or more and more preferably 80 or more in order to secure a carrier path between the electrodes (channel).

A substrate 7 preferably includes a sheet made of silicon, glass, or flexible resin, and for example, a plastic film can be used as the sheet. Examples of the plastic film includes films of polyethylene terephthalate (PET), polyethylene naphthalate (PEN), polyether sulfone (PES), polyether imide, polyether ether ketone, polyphenylene sulfide, polyarylate, polyimide, polycarbonate (PC), cellulose triacetate (TAC), cellulose acetate propionate (CAP), and the like. By using such a plastic film, it is possible to decrease the weight and improve portability and resistance to impact as compared with use of a glass substrate.

Materials which form the source electrode 5, the drain electrode 6, and the gate electrode 8 are not particularly limited as long as they are conductive materials. Usable materials include platinum, gold, silver, nickel, chromium, copper, iron, tin, antimonial lead, tantalum, indium, palladium, tellurium, rhenium, iridium, aluminum, ruthenium, germanium, molybdenum, tungsten, antimony tin oxide, indium tin oxide (ITO), fluorine-doped zinc oxide, zinc, carbon, graphite, glassy carbon, silver paste, carbon paste, lithium, beryllium, sodium, magnesium, potassium, calcium, scandium, titanium, manganese, zirconium, gallium, niobium, sodium-potassium alloys, magnesium/copper mixtures, magnesium/silver mixtures, magnesium/aluminum mixtures, magnesium/indium mixtures, aluminum/aluminum oxide mixtures, lithium/aluminum mixtures, and the like. In particular, platinum, gold, silver, copper, aluminum, indium, ITO, and carbon are preferred. Also, known conductive polymers improved in conductivity by doping or the like, for example, conductive polyaniline, conductive polypyrrole, conductive polythiophene, and complex of polyethylene dioxythiophene and polystyrenesulfonic acid are preferably used. In particular, materials having small electric resistance in a contact surface with a semiconductor layer are preferred.

A method for forming an electrode is a method of forming an electrode through a pattern mask by a method of evaporation or sputtering, a method of forming an electrode by a known photolithography method or liftoff method using a conductive thin film formed by a method of evaporation or sputtering, or a method of etching a metal foil of aluminum or copper using a resist formed by thermal transfer or ink jet. An electrode may be formed by direct patterning by ink jet of a solution or dispersion of conductive polymer or a conductive fine particle dispersion, or may be formed by lithography or laser ablation of a coated film. In addition, a method of patterning an ink containing conductive polymer or conductive fine particles or a conductive paste by a printing method such as relief printing, intaglio printing, screen printing, letter press reverse printing, or micro-contact printing method can be used.

As the gate insulating layer 9, various insulating films can be used. In view of cost merit, a polymeric organic material is preferably used, and an inorganic oxide with high dielectric constant is preferably used for achieving high characteristics. Examples of the polymeric organic material include well-known conventional polymers such as polyimide, polyamide, polyester, polyacrylate, photo-radical polymerization- or photo-cationic polymerization-type photocurable resins, copolymers containing acrylonitrile components, polyvinyl phenol, polyvinyl alcohol, novolac resins, epoxy resins, and cyanoethyl pullulan. Examples of the inorganic oxide include silicon oxide, aluminum oxide, tantalum oxide, titanium oxide, tin oxide, vanadium oxide, barium strontium titanate, barium zirconate titanate, lead zirconate titanate, lead lanthanum titanate, strontium titanate, barium titanate, barium magnesium fluoride, bismuth titanate, strontium bismuth titanate, strontium bismuth tantalate, bismuth tantalate niobate, yttrium trioxide, and the like. Among these, silicon oxide, aluminum oxide, tantalum oxide, and titanium oxide are preferred. Inorganic nitrides such as silicon nitride and aluminum nitride can also be preferably used.

Examples of a method for forming the insulating film include dry processes such as a vacuum evaporation method, a molecular beam epitaxial growth method, an ion cluster beam method, a low-energy ion beam method, an ion plating method, a CVD method, a sputtering method, and an atmospheric-pressure plasma method; wet process such as an ink jet printing method; a gravure printing method, a gravure offset printing method; an offset printing method; a relief printing method; a letter press reverse printing method; a screen printing method; a micro contact printing method; a reverse method; an air doctor coater method; a blade coater method; an air knife coater method; a roll coater method; a squeeze coater method; an impregnated coater method; a transfer roll coater method; a kiss coater method; a cast coater method; a spray coater method; a die coater method; a spin coater method; a bar coater method; a slit coater method; and a drop cast method. When precise pattering is required, a wet process such as an ink jet printing method, a letter press reverse printing method, or a micro contact printing method can be appropriately used according to the materials.

As the wet process for the inorganic oxide, a method of applying and drying a dispersion prepared by dispersing inorganic oxide fine particles in a desired organic solvent or water, if required, using a dispersion auxiliary such as a surfactant, or a method of applying and drying a solution of an oxide precursor, for example, an alkoxide, so-called sol-gel method, can be used.

The dry thickness of the insulating film is 0.1 to 2 μm and preferably 0.3 to 1 μm.

Figure 3:
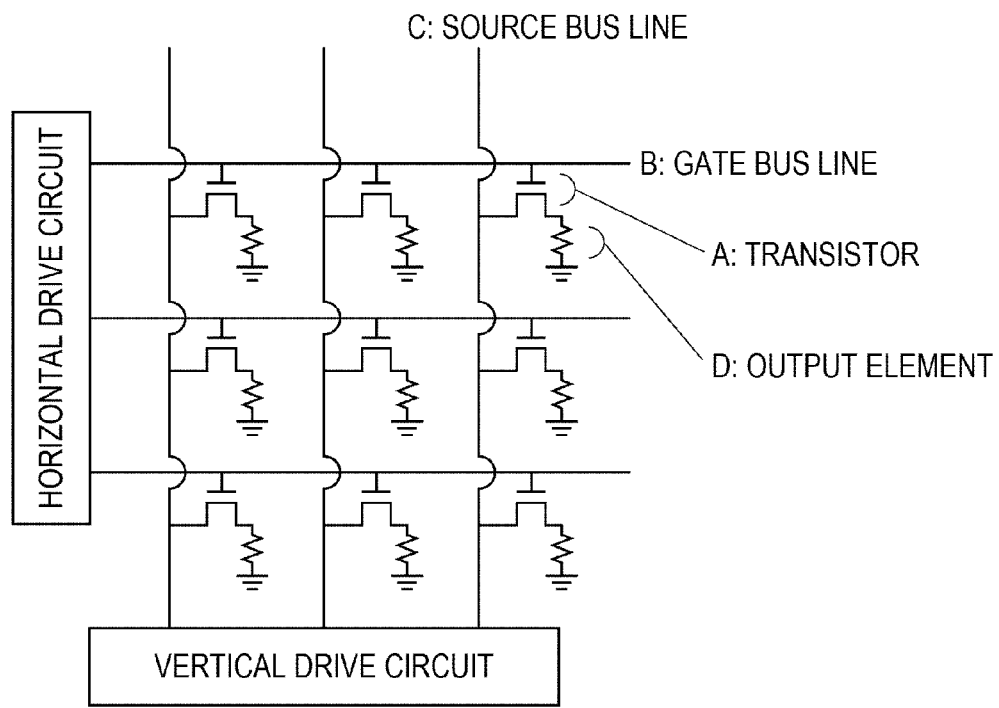
FIG. 3 is a schematic view showing equivalent circuits of a transistor array containing transistors serving as electronic elements according to the present invention.

A transistor serving as an electronic element according to the present invention can form an electronic component module by integration. Examples of the electronic component module include a transistor array serving as a back substrate of a display or the like, an inverter and a ring oscillator serving as logic circuits of RFID. FIG. 3 is a schematic plan view showing equivalent circuits of a transistor array and FIG. 4 is a schematic sectional view of one pixel in the transistor array.

In FIG. 3, the transistor array includes a large number of transistors A arranged in a matrix. Character B denotes a gate bus line connected to the gate electrodes of the transistors, and character C denotes a source bus line connected to the source electrodes of the transistors A. In addition, an output element D is connected to the drain electrode of each of the transistors A. The output element D corresponds to a display element including a liquid crystal, an electrophoresis element, or the like.

Figure 4:
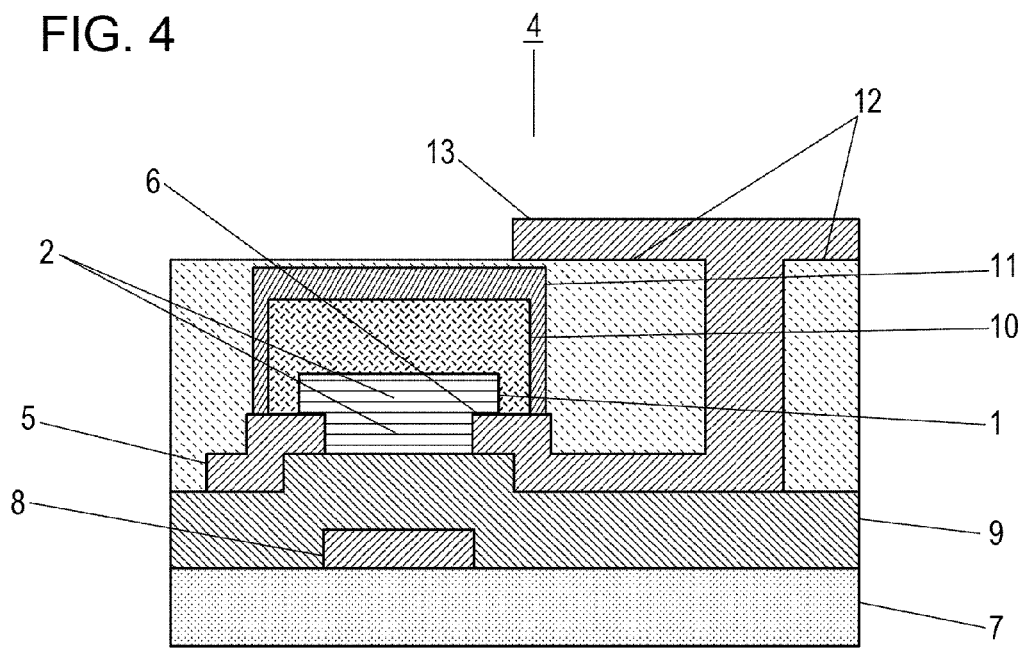
FIG. 4 is a schematic sectional view of one pixel in a transistor array containing transistors serving as electronic elements according to the present invention.

In FIG. 4, a sealing layer 10 is provided on the phthalocyanine nanowire film 1, and is covered with a light-shielding film 11. In addition, the whole is covered with an interlayer insulating film 12.

(Method for Producing Phthalocyanine Nanowires)

Next, methods (I) and (II) for producing the phthalocyanine nanowires of the present invention are described.

<Production Method (I)>

This production method includes:

(1) a step (a) of forming a complex by dissolving phthalocyanine and a phthalocyanine derivative in an acid and then precipitating the phthalocyanine and the phthalocyanine derivative in a poor solvent;

(2) a step (b) of forming a size-reduced complex by reducing the size of the complex;

(3) a step (c) of preparing a dispersion by dispersing the size-reduced complex in an organic solvent; and (4) a step (d) of forming nanowires by heating the dispersion.

Step (a)

It is generally known that phthalocyanines are soluble in an acid solvent such as sulfuric acid, and in the method for producing the phthalocyanine nanowires of the present invention, first, the phthalocyanine and the phthalocyanine derivative are dissolved in an acid solvent such as sulfuric acid, chlorosulfuric acid, methanesulfonic acid, trifluoroacetic acid, or the like. Then, the resultant solution is poured into a poor solvent such as water to precipitate a complex of the phthalocyanine and the phthalocyanine derivative.

The mixing ratio of the phthalocyanine derivative to the phthalocyanine is preferably in the range of 5% by mass to 200% by mass, more preferably in the range of 30% by mass to 120% by mass. When the mixing ratio is 5% by mass or more, nanowires tend to be satisfactorily formed by crystal growth in one direction through the step described below due to the function of a functional group or polymer side chain possessed by the phthalocyanine derivative. On the other hand, when the mixing ratio is in the range of 200% by mass or less, nanowires are satisfactorily formed by crystal growth in one direction because the amount of the functional groups or polymer side chains is not so large as to inhibit crystal growth, thereby not producing an amorphous state or particles.

The amount of the phthalocyanine and the phthalocyanine derivative added to the acid solvent is not particularly limited as long as it is a concentration at which they can be completely dissolved without producing an undissolved portion. However, the amount is preferably in a range of 20% by mass or less which allows the solution to maintain such a degree of viscosity as to have sufficient mobility.

When the solution prepared by dissolving the phthalocyanine and the phthalocyanine derivative is poured into a poor solvent such as water to precipitate a complex of the phthalocyanine and the phthalocyanine derivative, the amount of the solution is preferably in the range of 0.01% by mass to 50% by mass based on the poor solvent. If the amount is 0.01% by mass or more, the concentration of the precipitated complex is sufficiently high, and thus the solid content can be easily collected. If the amount is 50% by mass or less, the phthalocyanine and the phthalocyanine derivative are completely precipitated to form a solid complex without a dissolved component, thereby facilitating collection.

The poor solvent is not particularly limited as long as the phthalocyanine and the phthalocyanine derivative are insoluble or slightly soluble in the poor solvent, but water which can maintain high homogeneity of the precipitated complex and which causes little environmental load suitable for the size reducing step described below, or an aqueous solution containing water as a main component can be used as the most preferred poor solvent.

As a result of observation with a transmission electron microscope, it was confirmed that the complex of the phthalocyanine and the phthalocyanine derivative prepared in the step (a) is uniformly present in an amorphous state.

The hydrous complex can be collected by filtering the complex with a filter paper and a Buchner funnel to remove acid water and washing with water until a filtrate is neutralized. The collected complex is dehydrated and dried to remove water, or when fine particles of collected complex are formed by a wet dispersion method in the next step, the collected complex may remain in a hydrous state.

Step (b)

The size reducing method of the complex is not particularly limited as long as the complex prepared in the step (a) can be size-reduced, but the complex is preferably size-reduced by a wet dispersion method. For example, the complex which is prepared in the step (a) is size-reduced by wet-dispersing the complex together with a dispersion solvent such as water using a beads mill or a paint conditioner. The mass ratio of the complex to the dispersion solvent is not particularly limited, but from the viewpoint of dispersion efficiency, dispersion is preferably performed at a solid concentration within a range of 1% by mass to 30% by mass. The dispersion is preferably performed using micro media such as zirconia beads, and the diameter of the beads is considered to be in a range of 0.01 mm to 2 mm in view of the degree of size reduction of the complex. In addition, the most preferred amount of the micro media for size reduction is in a range of 100% by mass to 1000% by mass based on the dispersion of the complex from the viewpoint of the efficiency of size reduction and the efficiency of collection.

In addition, the resultant aqueous dispersion of a size-reduced complex is preferably dehydrated and dried to remove water. The dehydration and drying method is not particularly limited, but filtration, centrifugal separation, evaporation by a rotary evaporator, or the like can be used. After dehydration, the size-reduced complex may be further dried with a vacuum dryer or the like until water is completely removed. Further, after the hydrous complex prepared in the step (a) is dried to completely remove water, the complex may be wet-dispersed in an organic solvent such as N-methylpyrrolidone or dichlorobenzene to form a size-reduced complex.

Step (c)

The size-reduced complex formed in the step (b) are dispersed in an organic solvent, such as N-methylpyrrolidone, supplied for forming nanowires. The organic solvent is not particularly limited as long as it has affinity to phthalocyanines, but for example, an amide solvent and an aromatic organic solvent, which have high affinity to phthalocyanines, are preferred. Specifically, most preferred organic solvents include N,N-dimethylacetamide, N,N-dimethylformamide, N-methylpyrrolidone, toluene, xylene, ethylbenzene, chlorobenzene, and dichlorobenzene, which have particularly high affinity to phthalocyanine. The amide organic solvent and aromatic organic solvent can be used alone or as a mixture of the amide organic solvent and the aromatic organic solvent at a desired ratio, or may be used in combination with another organic solvent.

From the viewpoint that formation of nanowires can be promoted in a heating step described below, examples of an organic solvent which can be combined with the amide organic solvent and the aromatic organic solvent include glycol esters such as ethylene glycol monomethyl ether acetate, propylene glycol monomethyl ether acetate, diethylene glycol monobutyl ether acetate, and diethylene glycol monoethyl ether acetate. Such an organic solvent may be added after the size-reduced complex is dispersed in the amide organic solvent and the aromatic organic solvent or may be mixed with the organic solvents before the size-reduced complex is added and dispersed.

With respect to the amount of the organic solvents added to the size-reduced complex, the solid content of the size-reduced complex relative to the organic solvents is in the range of 0.1% to 20%, more preferably in the range of 1% to 10%, from the viewpoint of providing appropriate mobility and preventing aggregation.

When the size-reduced complex is prepared by water dispersion in the step (b), the size-reduced complex dehydrated by centrifugal separation can be dispersed in the organic solvents or even when the dispersion contains water, the nanowires can be formed by the step described below.

Step (d)

The phthalocyanine nanowires can be produced by heating the organic solvent dispersion of the size-reduced complex prepared through the step (c). The heating temperature is preferably in the range of 50° C. to 250° C., and more preferably 100° C. to 200° C. When the heating temperature is 50° C. or more, crystal growth of phthalocyanines can be sufficiently induced, and the intended crystal growth to nanowires in one direction can be performed. When the heating temperature is 250° C. or less, substantially no aggregation or fusion of nanowires occurs, and coarsening by crystal growth in the width direction does not occur. Although the heating time is not particularly limited, heating is preferably performed for at least 10 minutes until phthalocyanine nanowires are grown to a length of 100 nm or more.

The phthalocyanine nanowires having a width (minor diameter) of 100 nm or less and a ratio (length/minor diameter) of the length to the minor diameter of 10 or more can be produced by treatments in the steps (a) to (d). A mechanism of forming the nanowires in the step (d) through the step (a) of forming the complex of the phthalocyanine and the phthalocyanine derivative by precipitation and the step (b) of forming the size-reduced complex is not necessarily known. However, it can be supposed that the nanowires are formed in the step (d) of heating the size-reduced complex formed in the step (b) and having a particle diameter of 10 nm to 20 nm so that the size-reduced complex particles are connected in a crystal plane direction of phthalocyanine to cause crystal growth in only one direction. In this case, the organic solvent used in the step (c) is considered to function as a good dispersion medium for phthalocyanine, thereby inducing crystal growth in one direction and promoting the formation of nanowires.

<Production Method (II)>

This production method is characterized by reacting an isoindoline compound and metal ion in the presence of a phthalocyanine derivative in a water-soluble polyhydric alcohol.

That is, in the production method, a phthalocyanine derivative, an isoindoline compound, and metal ion are dissolved in a water-soluble polyhydric alcohol and sufficiently stirred to prepare a uniform mixed solution.

When the stirring temperature is higher than 80° C., a phthalocyanine compound having a nonuniform shape may be produced in a portion in a stage of insufficient mixing, or the yield may be decreased. Therefore, stirring is preferably performed at 80° C. or less.

After a polyhydric alcohol solution of the phthalocyanine derivative, the isoindoline compound and the metal salt is mixed at a temperature of 80° C. or less to prepare a mixed solution, the mixed solution is heated to 80° C. to 120° C., specifically 100° C. to 180° C., under stirring to react the isoindoline compound and metal ion, thereby forming a solid reaction product.

Alternatively, a polyhydric alcohol mixed solution containing the isoindoline compound and the metal salt may be added dropwise to a water-soluble polyhydric alcohol solution containing the phthalocyanine derivative dissolved therein, and the mixed solution may be heated to the same set temperature range as described above to react the isoindoline compound and metal ion, thereby forming a solid reaction product.

From a stoichiometric viewpoint, the mixing ratio of the isoindoline compound to the metal salt is preferably adjusted so that the amount of metal ion is 1 to 4 moles relative to 4 moles of the phthalocyanine compound as a raw material.

Examples of the water-soluble polyhydric alcohol which can be used in the present invention include α-glycols such as ethylene glycol, propylene glycol, 1,2-butanediol, and 2,3-butanediol, and glycerin. In the molecular structure, preferably, carbon atoms to each of which two or three hydroxyl groups are bonded are adjacent to each other.

As the phthalocyanine derivative used in the present invention, a compound which contains a phthalocyanine ring substituted by at least one sulfamoyl group and which shows solubility in polyhydric alcohols can be used. More specifically, a compound represented by the general formula (1) can be used.

In the production method, Y in the general formula (1) is not particularly limited as long as it is a water-soluble polymer chain having a number-average molecular weight of 1000 or more, but a water-soluble polymer of 1000 or more and 10000 or less is more preferred. Such a water-soluble polymer chain is not particularly limited as long as it has water solubility and exhibits affinity to water-soluble polyhydric alcohols. More specifically, a polymer residue having polyalkylene oxide as a partial structure can be used. In more detail, any polymer chain having polyalkylene oxide as a partial structure, such as ethylene oxide polymer, ethylene oxide/propylene oxide copolymer, or the like, can be used, and the polymer chain may be produced by block polymerization or random polymerization. It is preferred that the polymer chain is derived from an alkylene oxide copolymer in which Y is a group represented by the general formula (2), and the phydrophilicty and lipophilicity are optimized according to the solubility in the polyhydric alcohol used. Here, Qs are each independently a hydrogen atom or a methyl group, and Q' is a noncyclic hydrocarbon group having 1 to 30 carbon atoms, which may be a straight-chain or branched hydrocarbon group and which may be a saturated hydrocarbon group or an unsaturated hydrocarbon group. Examples of such a noncyclic hydrocarbon group include straight-chain or branched saturated hydrocarbon groups such as a methyl group, an ethyl group, a n-propyl group, an isopropyl group, a n-butyl group, an isobutyl group, a n-pentyl group, a n-hexyl group, a n-octyl group, a 2-ethyl-hexyl group, a n-dodecyl group, a stearyl group, a n-tetracosyl group, a n-triacontyl group, and the like.

The straight-chain or branched unsaturated hydrocarbon group may be a hydrocarbon group having a double bond or a triple bond, and examples thereof include straight-chain or branched unsaturated hydrocarbon groups such as a vinyl group, a propenyl group, an isopropenyl group, a butenyl group, a pentenyl group, an isoprene group, a hexenyl group, a heptenyl group, an octenyl group, a decenyl group, a geranyl group, an ethynyl group, a 2-propynyl group, a 2-penten-4-ynyl group, and the like.

The number n of repetitions in a polyalkylene oxide portion is preferably 4 or more and 100 or less, more preferably 5 or more and 80 or less, most preferably 10 or more and 50 or less. When the number n of repetitions is less than 4, affinity to a dispersion solvent is insufficient, while when the number n exceeds 100, dispersion stability tends to decrease.

The phthalocyanine derivative represented by the general formula (1) can be produced by carefully combining known conventional methods, for example, by reacting copper phthalocyanine sulfonyl chloride and polyether amine (hereinafter abbreviated as "polyether monoamine") having an amine at an end of a polyether main chain. The copper phthalocyanine sulfonyl chloride as a raw material can be prepared by reaction between copper phthalocyanine and chlorosulfonic acid and/or thionyl chloride. On the other hand, the polyether monoamine as a raw material can be produced by a known conventional method. For example, the polyether monoamine can be prepared by reductively aminating a hydroxyl group at an end of a polyether skeleton using a nickel/copper/chromium catalyst, or by imidating a hydroxyl group at an end of a polyether skeleton according to Mitsunobu reaction (reference: Synthesis, 1-28 (1981)) and then aminating the group by hydrazine reduction (reference: Chem. Commun., 2062-2063 (2003)). The polyether monoamine is provided as a commercial product, for example, JEFFAMINE (trade name) M series of US Huntsman Corporation. Examples of the phthalocyanine derivative used in the present invention and represented by the general formula (1) include, but are not limited to, compounds of the formula (3) (wherein in the formula, Q represents a hydrogen atom or a methyl group, propylene oxide/ethylene oxide=30/70 (molar ratio), and average value of n=47.)

The isoindoline compound used in the present invention can be synthesized by a known method. For example, a phthalonitrile compound such as ortho phthalonitrile is reacted by being heat-dissolved in a polyhydric alcohol such as a-glycol or glycerin in the presence or without an organic base or metal alkoxide such as 1,2-diazabicyclo(5,4,0)undecene-7 (referred to as "DBU" hereinafter) to synthesize a reaction product of the phthalonitrile compound soluble in a water-soluble polyhydric alcohol and the polyhydric alcohol. According to research of the structure of the reaction product performed by the inventors, it has been supposed that the reaction product is an isoindoline compound. Therefore, in the present invention, the reaction product is referred to as the "isoindoline compound" hereinafter.

Phthalonitrile compounds which can be used in the present invention include ortho phthalonitrile which has two —CN groups at the ortho positions of a benzene ring or a naphthalene ring, and represented by, for example, the following formula [Chem. 19]:

[Chem. 19]

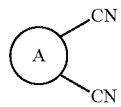

(In the formula, ring A represents a benzene ring or a naphthalene ring which may be substituted by an alkyl group, an alkoxy group, an alkylthio group, or a halogen group.) When the ring A is a benzene ring, a functional group such as a halogen atom or an alkyl group may be introduced to another position.

When the reaction temperature of the phthalonitrile compound and the water-soluble polyhydric alcohol is 80° C. or more, no problem occurs in the case in which the organic base or metal alkoxide is not added, but a metal-free phthalocyanine compound is produced at a higher temperature, thereby undesirably causing the need for a filtration step or the like. On the other hand, at a lower temperature, the reaction time may be increased. Therefore, in practice, the reaction is preferably made in the range of 100° C. to 130° C. for 15 minutes to 8 hours, more preferably 1 to 3 hours. The resultant solution containing the isoindoline compound is preferably cooled to 80° C. or less immediately after the reaction is terminated, thereby stopping further progress of the reaction. In addition, the reaction is preferably performed in a nitrogen atmosphere in order to avoid contamination with atmospheric moisture and also preferred to previously dehydrate the water-soluble polyhydric alcohol.

When the phthalonitrile compound and the polyhydric alcohol are reacted by adding the organic base such as DBU, the reaction can be effected at a lower temperature than that in the case not using the organic base, thereby causing an advantage in suppressing the formation of the metal-free phthalocyanine compound. Specifically, the reaction is preferably effected in the range of 30° C. to 100° C. for 10 minutes to 2 hours.

During the reaction between the phthalonitrile compound and the water-soluble polyhydric alcohol, the mass ratio is not particularly limited, but when the concentration of the phthalonitrile compound is 2% or less, productivity of the subsequent synthesis of a metal phthalocyanine compound may be decreased, while when the concentration is 40% or more, the viscosity of the resultant solution may be significantly increased, and the amount of the metal-free phthalocyanine compound may be increased. Therefore, the concentration of the phthalonitrile compound is preferably in the range of 2% by mass to 40% by mass, particularly in the range of 5% by mass to 20% by mass.

As the metal ion which can be used in the present invention, any metal ion which can be used as a central metal of metal phthalocyanine can be used. Specifically, copper ion, zinc ion, cobalt ion, nickel ion, or iron ion can be used. The metal ion is usually subjected to the reaction by dissolving the metal salt in the water-soluble polyhydric alcohol. As the salt, a halide or a sulfate can be used. For example, in the case of copper salt, copper(II) chloride or copper(II) sulfate can be preferably used as the salt.

When the isoindoline compound and the metal ion are reacted in the presence of the phthalocyanine derivative, a glycol solvent may be added to the water-soluble polyhydric alcohol containing the compound and the metal ion. As the glycol solvent, a glycol ester solvent is particularly preferred in view of the affinity to the produced metal phthalocyanine nanowires and the heating temperature. Specifically, for example, propylene glycol monomethyl ether acetate can be used as the solvent, but the solvent is not limited to this. The reason why the glycol solvent is preferred lies in the function to promote one-direction crystal growth for forming phthalocyanine nanowires of the present invention.

Among the above-described methods for producing the phthalocyanine nanowires of the present invention, the production method (I) is more preferred.

EXAMPLES

Example 1

Production of Phthalocyanine Nanowire Ink Composition

First, 210 parts by mass of copper phthalocyanine sulfonyl chloride (degree of sulfonation=1) was added to a mixture containing 692 parts by mass of Surfonamine B-200 (trade name) (primary amine-terminated poly(ethylene oxide/propylene oxide) (5/95) copolymer, number-average molecular weight: about 2,000) manufactured by Huntsman Corporation as a polyether monoamine, 66 parts by mass of sodium carbonate, and 150 parts by mass of water, followed by reaction at 5° C. to room temperature for 6 hours. The resultant reaction mixture was heated to 90° C. under vacuum to remove water, thereby producing a copper phthalocyanine sulfamoyl compound represented by [Chem. 20] below.

[Chem. 20]

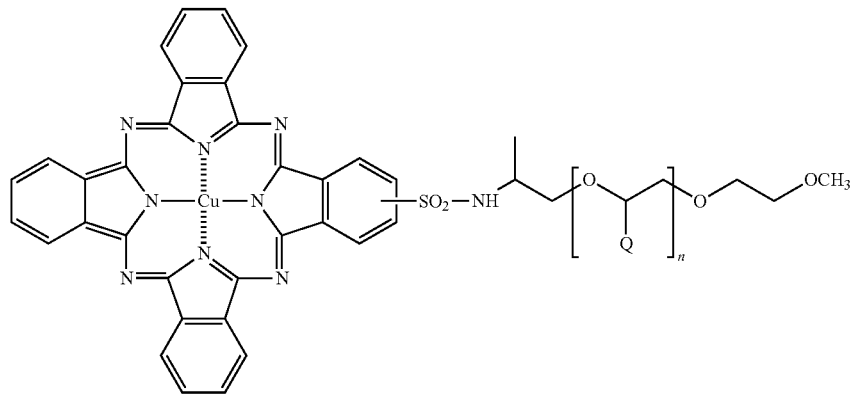

In the compound, Q represents a hydrogen atom or a methyl group, propylene oxide/ethylene oxide=29/6 (molar ratio), and average of n=35.

Step (1) (Precipitation Step)

First, 1.0 g of copper phthalocyanine (Fastogen Blue 5380 E, manufactured by DIC Corporation) and 1.5 g of a copper phthalocyanine sulfamoyl compound represented by [Chem. 20] as a phthalocyanine derivative were added to 81 g of concentrated sulfuric acid (manufactured by Kanto Chemical Co., Ltd.) and completely dissolved, thereby preparing a conc. sulfuric acid solution. Then, 730 g of distilled water was placed in a 1000 mL beaker and sufficiently cooled with iced water, and then the previously prepared conc. sulfuric acid solution was added to the distilled water under stirring to precipitate a complex composed of the copper phthalocyanine and the copper phthalocyanine sulfamoyl compound represented by [Chem. 20].

Then, the resultant complex was filtered off with filter paper and sufficiently washed with distilled water to collect the hydrous complex. As a result of measurement of the weight of the hydrous complex, the weight was 12.4 g.

Step (2) (Water Dispersion Step)

In a polypropylene vessel of 50 mL volume, 12.4 g of the hydrous complex containing 2.5 g of the complex prepared in the step (1) and composed of the copper phthalocyanine and the copper phthalocyanine sulfamoyl compound represented by [Chem. 20] was placed. Further, 4.3 g of distilled water was added so that the weight ratio of the complex to water was 15%. Next, 60 g of zirconia beads of 0.5 mm in diameter was added, and the resultant mixture was finely dispersed with a paint shaker for 2 hours. Then, the size-reduced complex was separated and collected from the zirconia beads, and further distilled water was added to produce 50 g in weight of a size-reduced complex aqueous dispersion (solid content 5%).

Step (3) (Organic Solvent Dispersion Step)

First, 10 g was collected from the size-reduced complex aqueous dispersion prepared in the step (2), and 0.5 g of a 5N aqueous hydrochloric acid solution (manufactured by Wako Pure Chemical Industries, Ltd.) was further added, followed by centrifugation at 2000 revolutions for 1 hour, thereby precipitating the size-reduced complex. The aqueous hydrochloric acid solution as a supernatant was removed, 4.5 g of N-methylpyrrolidone (manufactured by Wako Pure Chemical Industries, Ltd.) was added to the hydrous size-reduced complex, and the resultant mixture was sufficiently shaken. The resultant dispersion was placed in a 100 mL eggplant-type flask, and 5.0 g of ethylene glycol monomethyl ether acetate (manufactured by Wako Pure Chemical Industries, Ltd.) was further added, followed by stirring for 1 hour.

Step (4) (Nanowire Forming Step)

The eggplant-type flask containing N-methylpyrrolidone containing the size-reduced complex dispersed therein and the ethylene glycol monomethyl ether acetate was heated to 145° C. over 90 minutes in an oil bath. After the temperature reached 145° C., the flask was continuously heated at the same temperature for further 30 minutes.

After heating, the dispersion was filtered with a membrane filter (pore size 0.1 μm), and the residue was well washed with N-methylpyrrolidone. Then, the residue was placed in N-methylpyrrolidone so that the solid content was 20, followed by sufficient shaking to produce copper phthalocyanine nanowire ink composition (1) (N-methylpyrrolidone dispersion).

Figure 5:
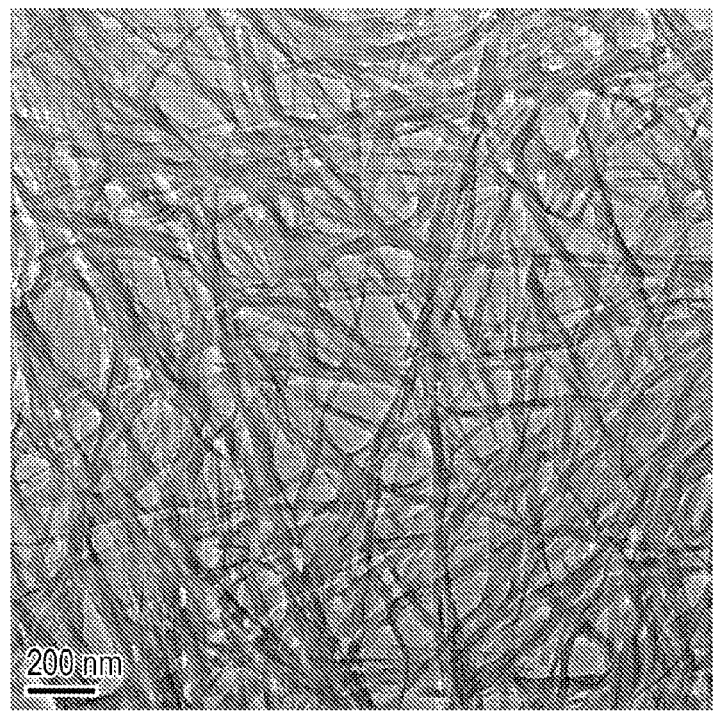
FIG. 5 is a transmission electron microscope photograph of phthalocyanine nanowires in Example 1.
Figure 6:
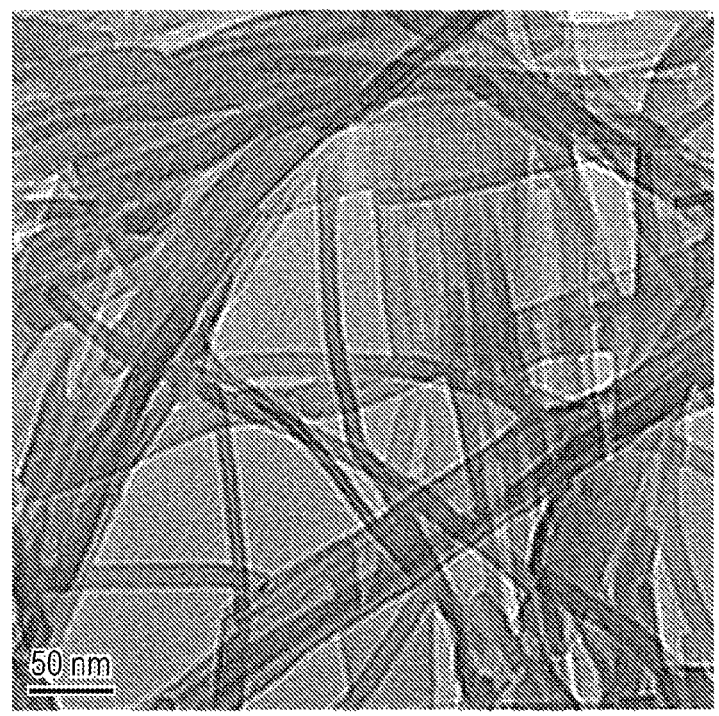
FIG. 6 is a transmission electron microscope photograph of phthalocyanine nanowires in Example 1.

As a result of observation of the solid content of the resultant phthalocyanine nanowire ink composition (1) with a transmission electron microscope, it was confirmed that the composition (1) has the shape of nanowires grown to a minor diameter of about 6 nm and a ratio of length to minor diameter of 80 or more (refer to FIGS. 5 and 6). Further, as a result of X-ray diffraction (using RINT-ULTIMA+ manufactured by Rigaku Industrial Corporation), it was confirmed that the resultant phthalocyanine nanowires show a sharp diffraction peak characteristic of a phthalocyanine compound and has high crystallinity. In addition, the phthalocyanine nanowire ink composition (1) was extremely stable, and sedimentation of the phthalocyanine nanowires was not observed.

<Production of Organic Transistor>

An n-type silicon substrate was prepared and used as a gate electrode, and a gate insulating film composed of silicon oxide was formed by thermally oxidizing a surface layer of the substrate. Then, the phthalocyanine nanowire ink composition (1) was deposited by spin coating to form a semiconductor film. Next, source and drain electrodes composed of a gold thin film were formed by patterning an evaporated film to produce an organic transistor (1), where the channel length L (distance between the source and drain electrodes) was 75 μm, and the channel width W was 5.0 mm.

Example 2

Production of Phthalocyanine Nanowire Ink Composition

Figure 7:
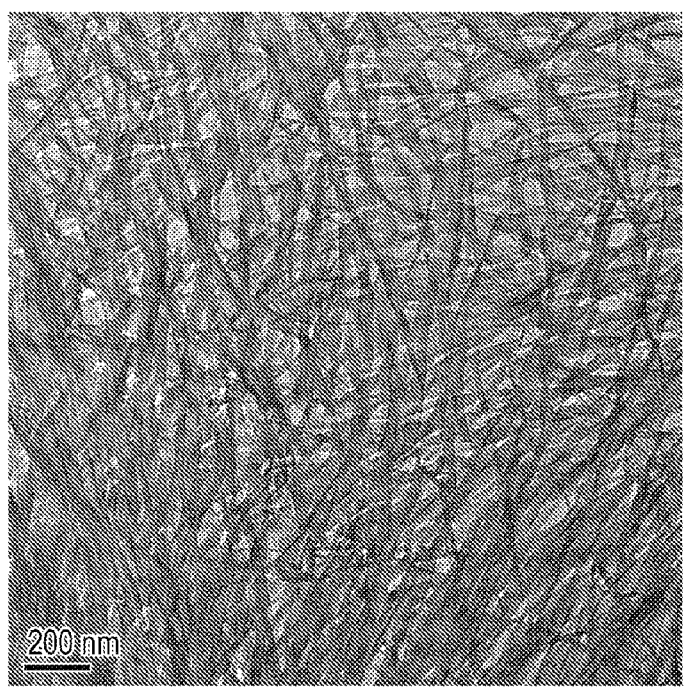
FIG. 7 is a transmission electron microscope photograph of phthalocyanine nanowires in Example 2.
Figure 8:
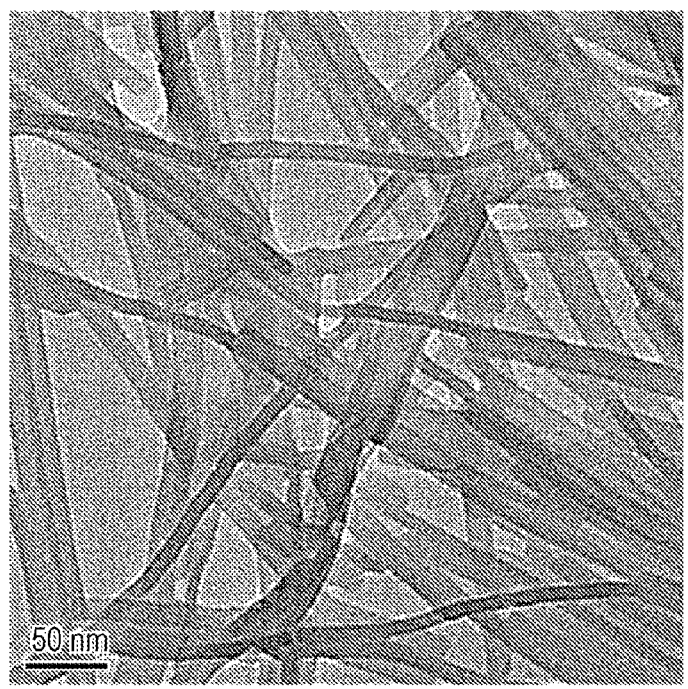
FIG. 8 is a transmission electron microscope photograph of phthalocyanine nanowires in Example 2.

A copper phthalocyanine nanowire ink composition (2) was produced by the same method as in Example 1 except that 1.67 g of copper phthalocyanine and 0.83 g of a phthalocyanine derivative of [Chem. 5] in place of [Chem. 20] in Example 1 were used. As a result of observation of phthalocyanine nanowires in the resultant phthalocyanine nanowire ink composition with a transmission electron microscope, it was confirmed that the nanowires have the shape of nanowires grown to a minor diameter of about 10 nm and a ratio of length to minor diameter of 50 or more (refer to FIGS. 7 and 8). Further, it was confirmed that the resultant phthalocyanine nanowires have high crystallinity characteristic of a phthalocyanine compound. In addition, the dispersion was extremely stable, and sedimentation of the phthalocyanine nanowires was not observed.

<Production of Organic Transistor>

An organic transistor (2) was produced by the same method as in Example 1 except that the phthalocyanine nanowire ink composition (1) used for producing a semiconductor film was changed to the phthalocyanine nanowire ink composition (2).

Example 3

Figure 9:
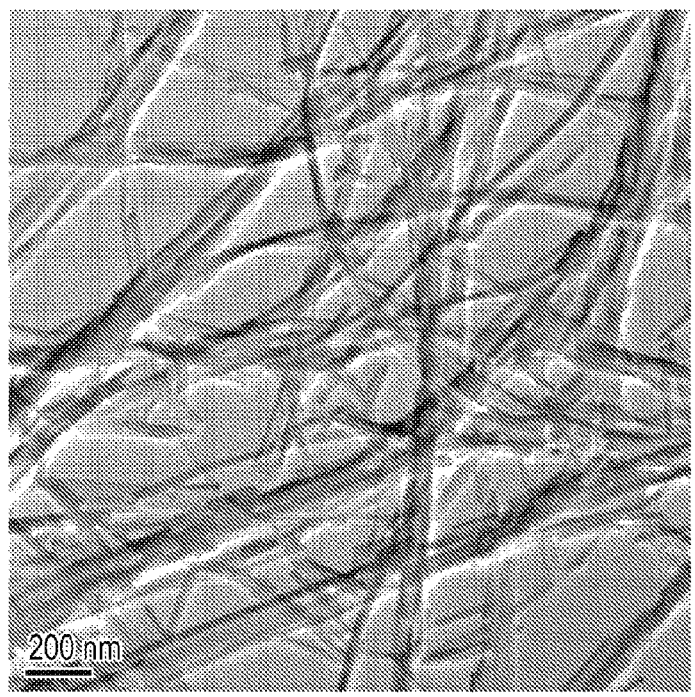
FIG. 9 is a transmission electron microscope photograph of phthalocyanine nanowires in Example 3.
Figure 10:
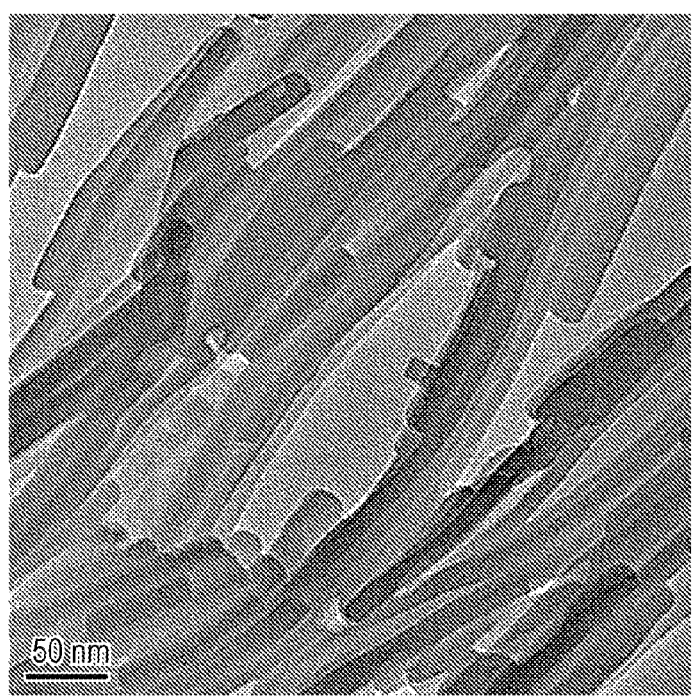
FIG. 10 is a transmission electron microscope photograph of phthalocyanine nanowires in Example 3.

Copper phthalocyanine nanowires were produced by the same method as in Example 1 except that 1.67 g of copper phthalocyanine and 0.83 g of a phthalocyanine derivative of [Chem. 6] in place of [Chem. 20] in Example 1 were used. As a result of observation of the resultant phthalocyanine nanowire dispersion with a transmission electron microscope, it was confirmed that the nanowires have the shape of nanowires grown to a minor diameter of about 25 nm and a ratio of length to minor diameter of 10 or more (refer to FIGS. 9 and 10). Further, it was confirmed that the resultant phthalocyanine nanowires have high crystallinity characteristic of a phthalocyanine compound. In addition, the dispersion was extremely stable, and sedimentation of the phthalocyanine nanowires was not observed.

Example 4

Figure 11:
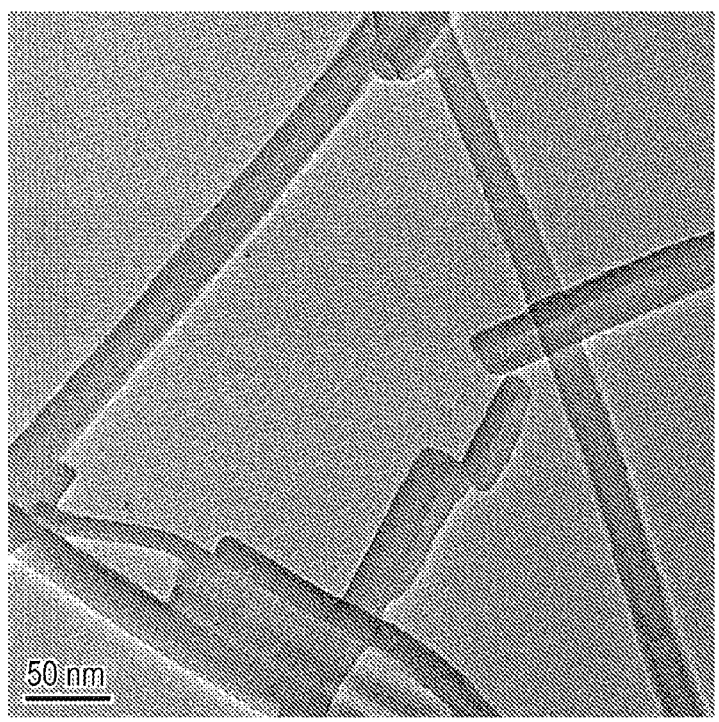
FIG. 11 is a transmission electron microscope photograph of phthalocyanine nanowires in Example 4.

Copper phthalocyanine nanowires were produced by the same method as in Example 1 except that 1.67 g of copper phthalocyanine and 0.83 g of a phthalocyanine derivative of [Chem. 7] in place of [Chem. 20] in Example 1 were used. As a result of observation of the resultant phthalocyanine nanowire dispersion with a transmission electron microscope, it was confirmed that the nanowires have the shape of nanowires grown to a minor diameter of about 30 nm and a ratio of length to minor diameter of 10 or more (refer to FIG. 11). Further, it was confirmed that the resultant phthalocyanine nanowires have high crystallinity characteristic of a phthalocyanine compound. In addition, the dispersion was extremely stable, and sedimentation of the phthalocyanine nanowires was not observed.

Example 5

Production of Phthalocyanine Nanowire Ink Composition

Figure 12:
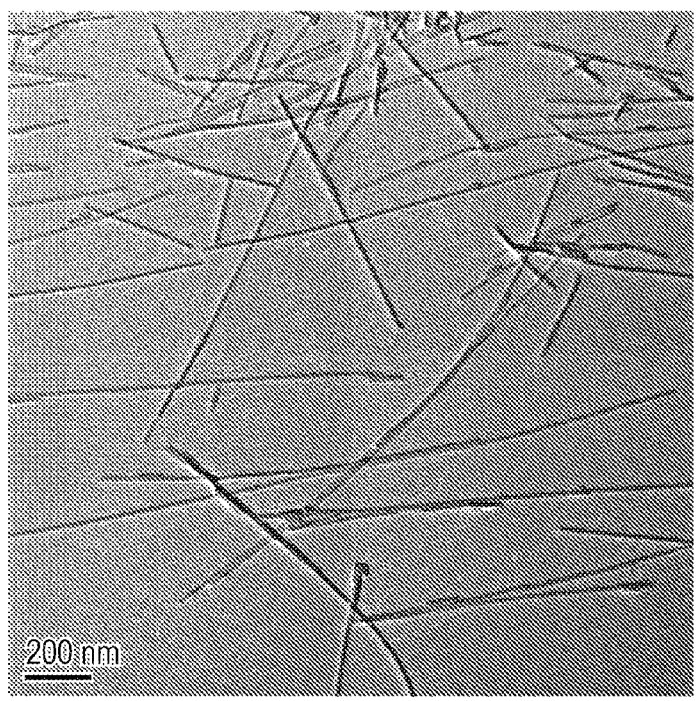
FIG. 12 is a transmission electron microscope photograph of phthalocyanine nanowires in Example 5.
Figure 13:
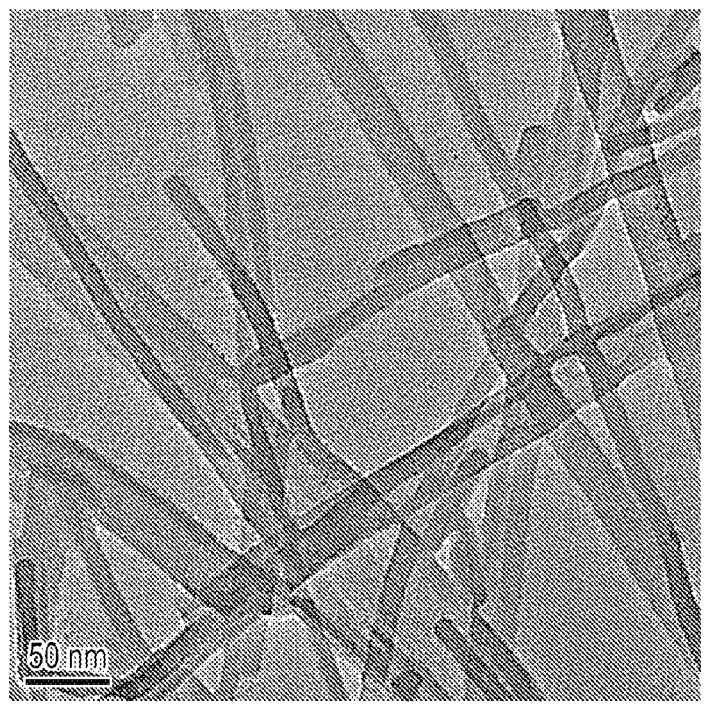
FIG. 13 is a transmission electron microscope photograph of phthalocyanine nanowires in Example 5.

A copper phthalocyanine nanowire ink composition (5) was produced by the same method as in Example 1 except that 1.67 g of copper phthalocyanine and 0.83 g of a phthalocyanine derivative of [Chem. 9] in place of [Chem. 20] in Example 1 were used. As a result of observation of phthalocyanine nanowires in the resultant phthalocyanine nanowire dispersion with a transmission electron microscope, it was confirmed that the nanowires have the shape of nanowires grown to a minor diameter of about 25 nm and a ratio of length to minor diameter of 20 or more (refer to FIGS. 12 and 13). Further, it was confirmed that the resultant phthalocyanine nanowires have high crystallinity characteristic of a phthalocyanine compound. In addition, the dispersion was extremely stable, and sedimentation of the phthalocyanine nanowires was not observed.

<Production of Organic Transistor>

An organic transistor (5) was produced by the same method as in Example 1 except that the phthalocyanine nanowire ink composition (1) used for producing a semiconductor film was changed to the phthalocyanine nanowire ink composition (5).

Example 6

Figure 14:
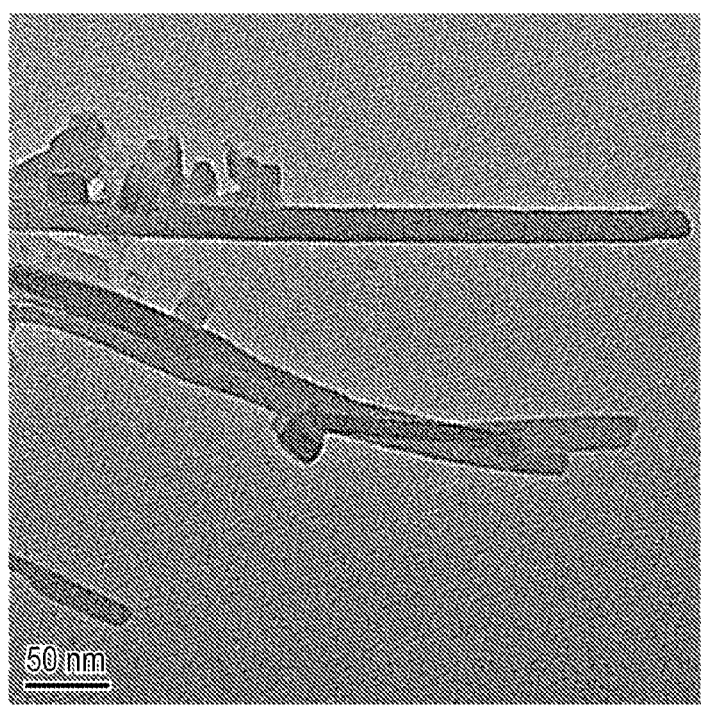
FIG. 14 is a transmission electron microscope photograph of phthalocyanine nanowires in Example 6.

Zinc phthalocyanine nanowires were produced by the same method as in Example 1 except that 1.67 g of zinc phthalocyanine and 0.83 g of a phthalocyanine derivative of [Chem. 4] in place of [Chem. 20] in Example 1 were used. As a result of observation of the resultant phthalocyanine nanowire dispersion with a transmission electron microscope, it was confirmed that the nanowires have the shape of nanowires grown to a minor diameter of about 25 nm and a ratio of length to minor diameter of 20 or more (refer to FIG. 14). Further, it was confirmed that the resultant phthalocyanine nanowires have high crystallinity characteristic of a phthalocyanine compound. In addition, the dispersion was extremely stable, and sedimentation of the phthalocyanine nanowires was not observed.

Example 7

Figure 15:
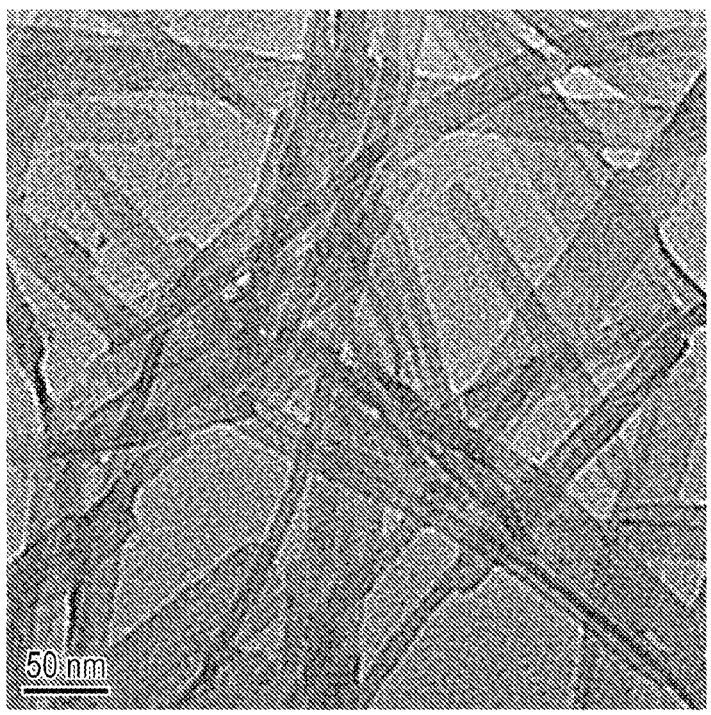
FIG. 15 is a transmission electron microscope photograph of phthalocyanine nanowires in Example 7.

Composite nanowires of copper phthalocyanine and metal-free phthalocyanine were produced by the same method as in Example 1 except that 1.67 g of metal-free phthalocyanine and 0.83 g of a phthalocyanine derivative of [Chem. 5] in place of [Chem. 20] in Example 1 were used. As a result of observation of the resultant phthalocyanine nanowire dispersion with a transmission electron microscope, it was confirmed that the nanowires have the shape of nanowires grown to a minor diameter of about 20 nm and a ratio of length to minor diameter of 20 or more (refer to FIG. 15). Further, it was confirmed that the resultant phthalocyanine nanowires have high crystallinity characteristic of a phthalocyanine compound. In addition, the dispersion was extremely stable, and sedimentation of the phthalocyanine nanowires was not observed.

Example 8

A hydrous complex was produced through the same precipitation step as in Example 1 except that 1.6 g of copper phthalocyanine and 1.2 g of a phthalocyanine derivative of [Chem. 9] in place of [Chem. 7] in Example 1 were used. The hydrous complex was dried to remove water under vacuum at 50° C. for 48 hours using a vacuum dryer, producing 2.61 g of a complex. Then, the complex was placed, together with 23.49 g of orthodichlorobenzene, in a polypropylene container of 50 mL volume, and 60 g of zirconia beads of 0.5 mm in diameter was added, followed by fine dispersion with a paint shaker for 2 hours. Then, resultant size-reduced complex was separated and collected from the zirconia beads, and orthodichlorobenzene was further added to prepare a size-reduced complex dispersion with a solid content of 2%. Then, 1 g of the dispersion was collected, and 1 g of orthodichlorobenzene was added to prepare a dispersion with a solid content of 1%, which was then placed in a stainless pressure cell of 2 mL volume and heated to 200° C. in an oven. In this case, the temperature was increased from 30° C. to 100° C. at 2° C./min and from 100° C. to 200° C. at 1° C./min, and maintained at 200° C. for 30 minutes after reaching 200° C., thereby producing phthalocyanine nanowires.

Figure 16:
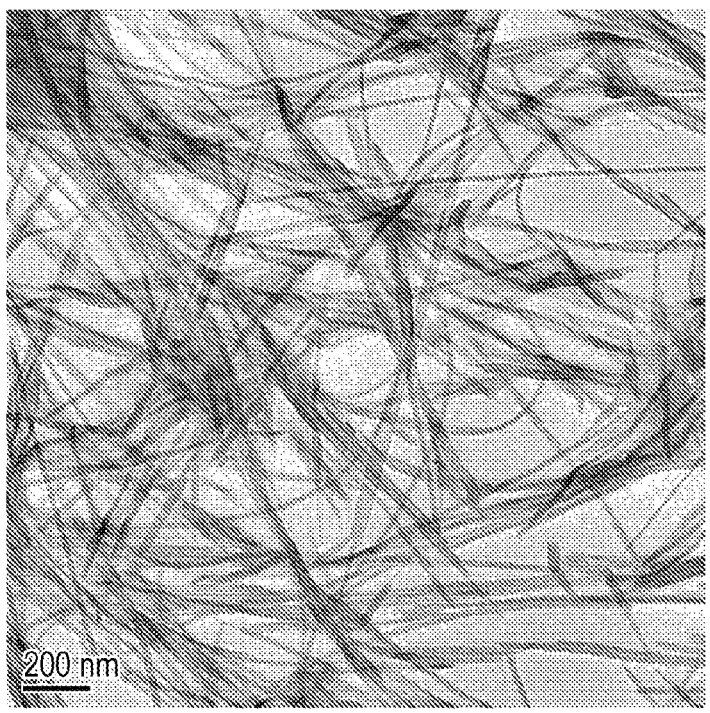
FIG. 16 is a transmission electron microscope photograph of phthalocyanine nanowires in Example 8.
Figure 17:
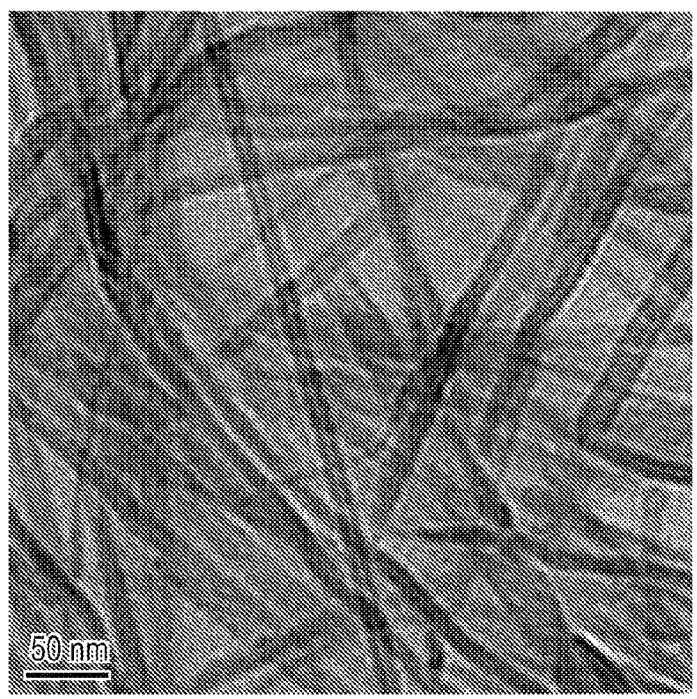
FIG. 17 is a transmission electron microscope photograph of phthalocyanine nanowires in Example 8.

Then, after cooling, the phthalocyanine nanowires were collected from the pressure cell and observed with a transmission electron microscope. As a result, it was confirmed that the nanowires have a shape grown to a minor diameter of about 10 nm and a ratio of length to minor diameter of 50 or more (refer to FIGS. 16 and 17). Further, it was confirmed that the resultant phthalocyanine nanowires have high crystallinity characteristic of a phthalocyanine compound. In addition, the dispersion was extremely stable, and sedimentation of the phthalocyanine nanowires was not observed.

Then, 1 g was collected from the orthodichlorobenzene dispersion of the phthalocyanine nanowires, and 1 g of chloroform was further added to prepare a phthalocyanine nanowire ink composition. A film from the ink composition was formed on a 2-cm square glass plate with a spin coater. As a film forming condition, the speed was increased to 1200 rotations within 10 seconds and maintained at 1200 rotations for 60 seconds.

As a result of observation of the film of the phthalocyanine nanowires with a laser microscope, a uniform flat film was formed, and the thickness was 150 nm.

Example 9

Synthesis of Phthalocyanine Derivative

In a round-bottom flask of 50 mL volume, 2.0 g of ortho-phthalonitrile (manufactured by Wako Pure Chemical Industries, Ltd.) and 38.0 g of ethylene glycol (manufactured by Wako Pure Chemical Industries, Ltd.) were placed, and 5 drops of 1,8-diazabicyclo[5,4.0]undec-7-ene were added under stirring, followed by heating dissolution of the ortho-phthalonitrile over 90 minutes in an oil bath adjusted to 40° C. The resultant solution was yellow in color without undissolved ortho-phthalonitrile.

In a round-bottom flask of 50 mL volume, 1.29 g of 4-(2',6'-dimethylphenoxy)-phthalonitrile (manufactured by Tokyo Chemical Industry Co., Ltd.) and 24.51 g of ethylene glycol were placed, and 3 drops of 1,8-diazabicyclo[5,4.0]undec-7-ene were added under stirring, followed by heating dissolution of the ortho-phthalonitrile over 90 minutes in an oil bath adjusted to 40° C. The resultant solution was yellow in color without undissolved ortho-phthalonitrile.

On the other hand, 0.70 g of copper(II) chloride (manufactured by Wako Pure Chemical Industries, Ltd.) and 13.30 g of ethylene glycol were placed in a round-bottom flask of 50 mL volume, and then the copper (II) chloride was dissolved by heating over 60 minutes in an oil bath adjusted to 100° C. to prepare an ethylene glycol solution of copper(II) chloride.

Next, the resultant two types of phthalonitrile solutions and copper chloride solution were added and mixed in a round-bottom flask of 100 mL volume, and the mixture was stirred at a temperature of 40° C. or less for 10 minutes to prepare a uniform mixed solution. Then, the flask was immersed in an oil bath previously heated to 150° C., and reaction was continued for 15 minutes under stirring.

After the completion of reaction, the flask was cooled to 80° C. or less, and 50 g of a 1N aqueous hydrochloric acid solution was added, followed by stirring for 30 minutes. Then, the contents in the flask were filtered with a 0.1 μm membrane filter, and the residue was washed with an aqueous sodium hydroxide solution at a concentration of 5% and washed with methanol, and then dried at 80° C. for 2 hours to produce a phthalocyanine derivative as a blue solid (collected amount: 1.8 g).

<Production of Phthalocyanine Nanowire Ink Composition>

Copper phthalocyanine nanowires were produced by the same method as in Example 1 except that 1.67 g of copper phthalocyanine and 0.83 g of the 4-(2',6'-dimethylphenoxy)-containing phthalocyanine derivative previously produced in place of [Chem. 20] in Example 1 were used. As a result of observation of the resultant phthalocyanine nanowire dispersion with a transmission electron microscope, it was confirmed that the nanowires have the shape of nanowires grown to a minor diameter of about 25 nm and a ratio of length to minor diameter of 20 or more. Further, it was confirmed that the resultant phthalocyanine nanowires have high crystallinity characteristic of a phthalocyanine compound. In addition, the dispersion was extremely stable, and sedimentation of the phthalocyanine nanowires was not observed.

Example 10

Production of Phthalocyanine Nanowire Ink Composition

A phthalocyanine nanowire ink composition (10) was produced by adding, to the phthalocyanine nanowire ink composition (1) of Example 1, polymethyl methacrylate (PMMA) (manufactured by Aldrich Corporation, molecular weight: 120,000) at 2% by mass relative to the total ink composition.

<Production of Organic Transistor>

An organic transistor (10) was produced by the same method as in Example 1 except that the phthalocyanine nanowire ink composition (1) used for producing a semiconductor film was changed to the phthalocyanine nanowire ink composition (10).

Example 11

Production of Phthalocyanine Nanowire Ink Composition

A phthalocyanine nanowire ink composition (11) was produced by adding, to the phthalocyanine nanowire ink composition (1) of Example 1, polystyrene (manufactured by Aldrich Corporation, molecular weight: 13,000) at 0.2% by mass relative to the total ink composition.

<Production of Organic Transistor>

An organic transistor (11) was produced by the same method as in Example 1 except that the phthalocyanine nanowire ink composition (1) used for producing a semiconductor film was changed to the phthalocyanine nanowire ink composition (11).

Example 12

Production of Phthalocyanine Nanowire Ink Composition

A phthalocyanine nanowire ink composition (12) was produced by adding, to the phthalocyanine nanowire ink composition (1) of Example 1, polystyrene (manufactured by Aldrich Corporation, molecular weight: 13,000) at 0.6% by mass relative to the total ink composition.

<Production of Organic Transistor>

An organic transistor (12) was produced by the same method as in Example 1 except that the phthalocyanine nanowire ink composition (1) used for producing a semiconductor film was changed to the phthalocyanine nanowire ink composition (12).

Example 13

Production of Phthalocyanine Nanowire Ink Composition

A phthalocyanine nanowire ink composition (13) with a solid content of 2% containing N-methylpyrrolidone as a dispersion solvent was produced by the same method as in Example 1 except that in the step (3) (organic solvent dispersion step) of Example 1, 9.5 g of N-methylpyrrolidone only was added to the hydrous size-reduced complex after centrifugation, followed by stirring for 1 hour.

<Production of Organic Transistor>

An organic transistor (13) was produced by the same method as in Example 1 except that the phthalocyanine nanowire ink composition (1) used for producing a semiconductor film was changed to the phthalocyanine nanowire ink composition (13).

Example 14

Production of Phthalocyanine Nanowire Ink Composition

A phthalocyanine nanowire ink composition (14) with a solid content of 2% containing N-methylpyrrolidone as a dispersion solvent was produced by the same method as in Example 1 except that in the step (1) (precipitation step) of Example 1, 1.2 g of a copper phthalocyanine sulfamoyl compound represented by [Chem. 9] was used.

<Production of Organic Transistor>

An organic transistor (14) was produced by the same method as in Example 1 except that the phthalocyanine nanowire ink composition (1) used for producing a semiconductor film was changed to the phthalocyanine nanowire ink composition (14).

Example 15

Production of Phthalocyanine Nanowire Ink Composition

A phthalocyanine nanowire ink composition (15) with a solid content of 20 containing N-methylpyrrolidone as a dispersion solvent was produced by the same method as in Example 1 except that in the step (1) (precipitation step) of Example 1, 1.0 g of a copper phthalocyanine sulfamoyl compound represented by [Chem. 20] was used.

<Production of Organic Transistor>

An organic transistor (15) was produced by the same method as in Example 1 except that the phthalocyanine nanowire ink composition (1) used for producing a semiconductor film was changed to the phthalocyanine nanowire ink composition (15).

Example 16

Production of Phthalocyanine Nanowire Ink Composition

A phthalocyanine nanowire ink composition (16) was produced by adding, to the phthalocyanine nanowire ink composition (5) of Example 5, poly(2-methoxy-5-(2'-ethylhexyloxy)-1,4-phenylenevinylene (manufactured by Aldrich Corporation, molecular weight: 150,000 to 200,000) at 0.6% by mass relative to the total ink composition.

<Production of Organic Transistor>

An organic transistor (16) was produced by the same method as in Example 1 except that the phthalocyanine nanowire ink composition (1) used for producing a semiconductor film was changed to the phthalocyanine nanowire ink composition (16).

Example 17

Production of Phthalocyanine Nanowire Ink Composition

A phthalocyanine nanowire ink composition (17) was produced by adding, to the phthalocyanine nanowire ink composition (5) of Example 5, regio-regular poly(3-hexylthiophene-2,5-diyl) (manufactured by Merck, Lisicon SP001) at 0.6% by mass relative to the total ink composition.

<Production of Organic Transistor>

An organic transistor (17) was produced by the same method as in Example 1 except that the phthalocyanine nanowire ink composition (1) used for producing a semiconductor film was changed to the phthalocyanine nanowire ink composition (17).

Comparative Example 1

Figure 18:
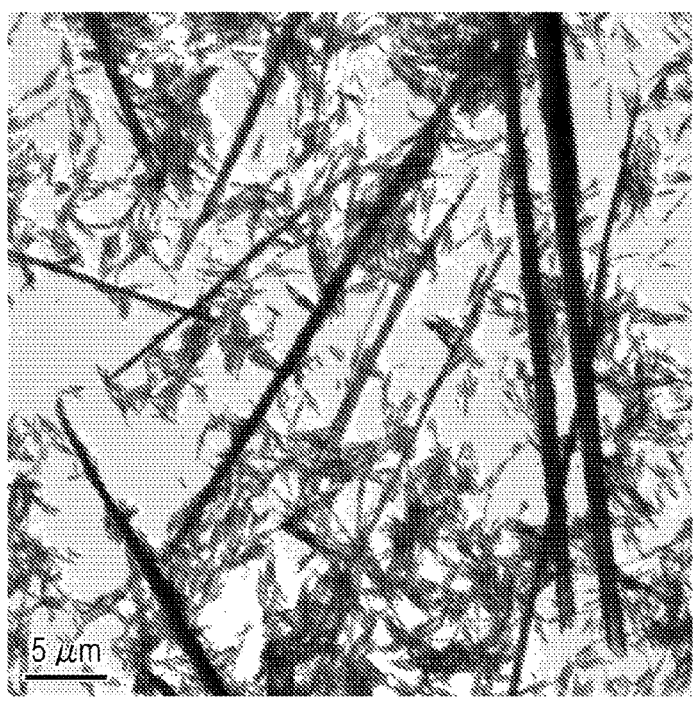
FIG. 18 is a high-powered transmission electron microscope photograph of a sample of wires formed using copper phthalocyanine alone.
Figure 19:
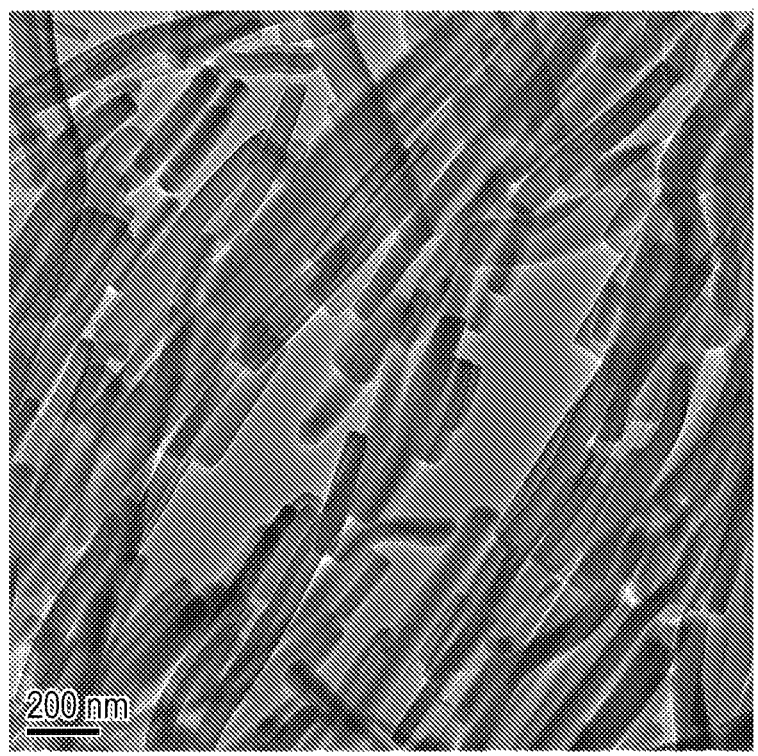
FIG. 19 is a high-powered transmission electron microscope photograph of a sample of wires formed using copper phthalocyanine alone.

A dispersion was prepared by the same treatment as in Example 1 except that only copper phthalocyanine was used without using the phthalocyanine derivative of Example 1. As a result of observation of the dispersion with a transmission electron microscope, a mixture of needle-like crystals coarsened to a length of several tens μm and plate-like crystals having a width of about 100 nm and a length/width ratio of less than 5 was observed, and nanowires were not formed. In addition, the dispersion was unstable and caused sedimentation within several minutes after shaking (refer to FIGS. 18 and 19).

Comparative Example 2

Production of Copper Phthalocyanine-Dispersed Ink Composition

A copper phthalocyanine-dispersed ink composition (2)' was produced by mixing 1.2 g of copper phthalocyanine, 0.6 g of a copper phthalocyanine sulfamoyl compound represented by [Chem. 20], 0.2 g of PMMA, and 98 g of N-methylpyrrolidone.

<Production of Organic Transistor>

An organic transistor (2)' was produced by the same method as in Example 1 except that the phthalocyanine nanowire ink composition (1) used for producing a semiconductor film was changed to the copper phthalocyanine-dispersed ink composition (2)'.

Comparative Example 3

Production of Phthalocyanine Rod-Dispersed Ink Composition

A N-methylpyrrolidone dispersion with a solid content of 2% was prepared by the same method as in Example 1 except that in the step (1) (precipitation step) in Example 1, 2.0 g of copper phthalocyanine (manufactured by DIC Corporation, Fastogen Blue 5380E) alone was used. As a result of observation of the resultant phthalocyanine rod-dispersed ink composition (3)' with a transmission electron microscope, plate-like copper phthalocyanine having a width of 100 nm or more and a length/width ratio of less than 20 was confirmed (refer to FIG. 15). In addition, the N-methylpyrrolidone dispersion had low stability and the copper phthalocyanine sedimented within several minutes after shaking.

<Production of Organic Transistor>

An organic transistor (3)' was produced by the same method as in Example 1 except that the phthalocyanine nanowire ink composition (1) used for producing a semiconductor film was changed to the phthalocyanine rod-dispersed ink composition (3)'.

<FET Evaluation>

Figure 20:
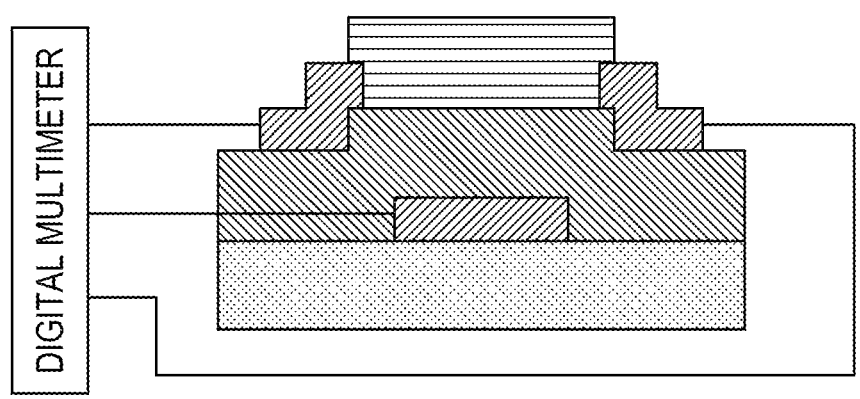
FIG. 20 is a schematic view of a transistor evaluation system.

The transistor characteristics of the organic transistors (2), (5), and (10) to (17) were measured (refer to FIGS. 2 and 20). The transistor characteristics were measured by a method of measuring a current (Id) between source and drain electrodes at an applied voltage of −80 V during the applying and sweeping of a voltage from 0 to −80 V (Vg) to a gate electrode with a digital multimeter (237, manufactured by Keithley Instruments Inc.). Mobility was determined from a slope of √Id–Vg by a known method. The unit was $cm^2/V·s$. In addition, an ON/OFF ratio (hereinafter, ON/OFF) was determined by (absolute maximum value of Id)/(absolute minimum value of Id). The results are shown in Table 1.

It is found that the organic transistors of the examples shown in Table 1 exhibit the transistor characteristics, mobility of $10^{-5}$ to $10^{-3}$ and ON/OFF of $10^3$ to $10^5$. On the other hand, the organic transistors of Comparative Examples 1 and 2 do not exhibit Id modulation with a gate voltage and thus not exhibit transistor characteristics.

TABLE 1

| | Mobility ($cm^2/V·s$) | ON/OFF |
|---|---|---|
| Example 1 | $10^{-4}$ | $10^3$ to $10^4$ |
| Example 2 | $10^{-4}$ | $10^3$ to $10^4$ |
| Example 5 | $10^{-3}$ | $10^4$ to $10^5$ |
| Example 10 | $10^{-4}$ | $10^3$ to $10^4$ |
| Example 11 | $10^{-4}$ | $10^3$ to $10^4$ |
| Example 12 | $10^{-5}$ | $10^3$ to $10^4$ |
| Example 13 | $10^{-4}$ | $10^3$ to $10^4$ |
| Example 14 | $10^{-4}$ | $10^3$ to $10^4$ |
| Example 15 | $10^{-4}$ | $10^3$ to $10^4$ |
| Example 16 | $10^{-4}$ | $10^3$ to $10^4$ |
| Example 17 | $10^{-4}$ | $10^3$ to $10^4$ |
| Comparative Example 2 | Without characteristic | Without characteristic |
| Comparative Example 3 | Without characteristic | Without characteristic |

According to the present invention, a semiconductor film forming ink with excellent dispersibility can be produced by using phthalocyanine nanowires, and a break-proof, lightweight, low-cost electronic element can be provided by applying the ink to OFET by a wet process.

Industrial Applicability

It is possible to form, by printing or coating (wet process), a film from an ink containing phthalocyanine nanowires composed of a molecular assembly having a nanosized wire-shaped crystal structure and having a wire breadth (minor diameter) of 100 nm or less and a ratio (length/minor diameter) of wire length to minor diameter of 10 or more. Therefore, a break-proof, lightweight, low-cost electronic element can be provided on a flexible plastic substrate.

REFERENCE SIGNS LIST

1 film (phthalocyanine nanowire film)
2 phthalocyanine nanowire
3 binder resin
4 transistor
5 source electrode
6 drain electrode
7 substrate
8 gate electrode
9 gate insulating film
10 sealing layer
11 light-shielding film
12 interlayer insulating film
13 pixel electrode

The invention claimed is:

1. An ink composition comprising phthalocyanine nanowires which contain phthalocyanine and a phthalocyanine derivative and an organic solvent as essential components, the ink composition being characterized in that:
   1) the phthalocyanine is copper phthalocyanine, zinc phthalocyanine, or iron phthalocyanine;
   2) the phthalocyanine derivative is represented by general formula (1), or (3) described below; and
   3) the minor diameter of the phthalocyanine nanowires is 100 nm or less, and the ratio (length/minor diameter) of the length to the minor diameter is 10 or more;

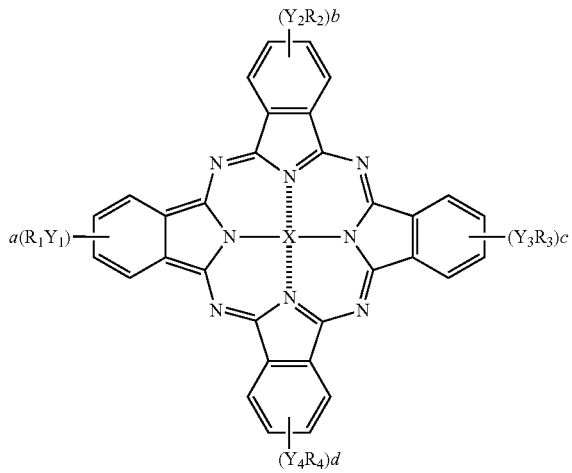

(1)

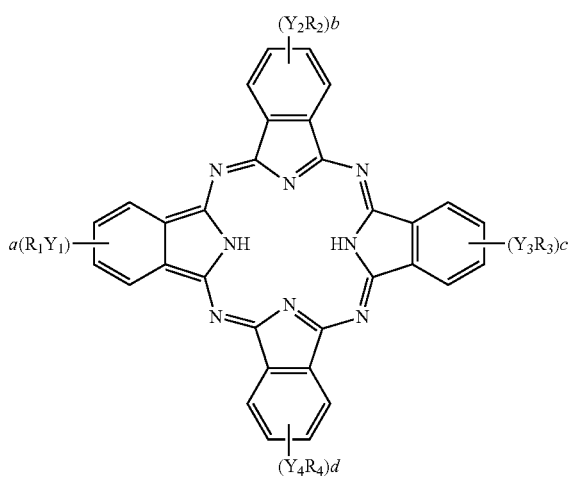

(2)

wherein in the formulae (1) and (2), X is selected from the group consisting of a copper atom, a zinc atom, a cobalt atom, a nickel atom, a tin atom, a lead atom, a magnesium atom, a silicon atom, and an iron atom, and $Y_1$ to $Y_4$ represent linking groups which bond a phthalocyanine skeleton to $R_1$ to $R_4$, respectively;

when $Y_1$ to $Y_4$ each represent a bond as the linking group, $R_1$ to $R_4$ each represent $SO_3H$, $CO_2H$, an alkyl group which may be substituted, an (oligo)aryl group which may be substituted, an (oligo)heteroaryl group which may be substituted, a phthalimide group which may be substituted, or a fullerene which may be substituted;

when $Y_1$ to $Y_4$ are each a linking group represented by —$(CH_2)_n$— wherein n represents an integer of 1 to 10, —CH═CH—, —C≡C—, —O—, —NH—, —S—, —S(O)—, or —S(O)$_2$—, $R_1$ to $R_4$ each represent an alkyl group which may be substituted, an (oligo)aryl group which may be substituted, an (oligo)heteroaryl group which may be substituted, a phthalimide group which may be substituted, or a fullerene which may be substituted; and a, b, c, and d each independently represent an integer of 0 to 2, but at least one of a, b, c, and d is 1;

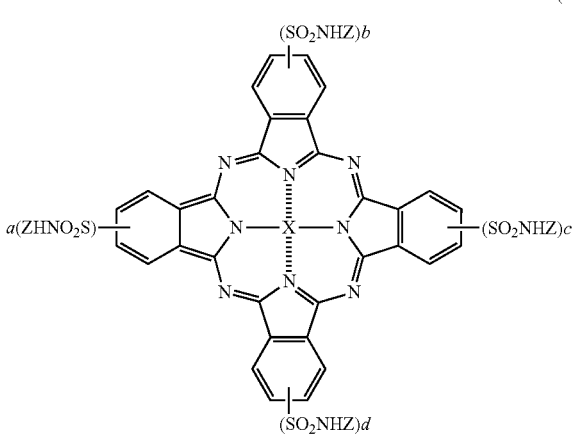

(3)

wherein in the formula (3), X is selected from the group consisting of a copper atom, a zinc atom, a cobalt atom, a nickel atom, a tin atom, a lead atom, a magnesium atom, a silicon atom, and an iron atom, Z is a group represented by a formula (a) or (b) described below, a, b, c, and d each independently represent an integer of 0 to 2 but at least one of a, b, c, and d is 1;

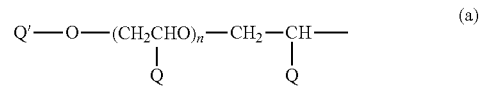

(a)

wherein n is an integer of 4 to 100, each Q is independently a hydrogen atom or a methyl group, and Q' is a noncyclic hydrocarbon group having 1 to 30 carbon atoms

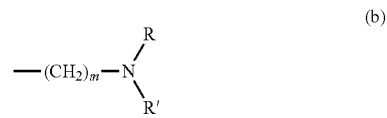

(b)

wherein m is an integer of 1 to 20, and R and R' are each independently an alkyl group having 1 to 20 carbon atoms.

2. The ink composition according to claim 1, wherein, in the general formula (1) or (2), the alkyl group which may be substituted is a methyl group, an ethyl group, or a propyl group, the (oligo)aryl group which may be substituted is an (oligo)phenylene group which may be substituted or an (oligo)naphthylene group which may be substituted, and the (oligo)heteroaryl group which may be substituted is an (oligo)pyrrole group which may be substituted, an (oligo)thiophene group which may be substituted, an (oligo)benzopyrrole group which may be substituted, or an (oligo)benzothiophene group which. may be substituted.

3. The ink composition according to claim 1, wherein the content of the phthalocyanine nanowires is in a range of 0.05% to 20% by mass.

4. The ink composition according to claim 1, wherein the organic solvent is at least one of an amide organic solvent, an aromatic organic solvent, or a halogen organic solvent.

5. The ink composition according to claim 4, wherein the amide organic solvent is N-methylpyrrolidone, N,N-dimethylformamide, N,N-diethylformamide, or N,N-dimethylacetamide.

6. The ink composition according to claim 4, wherein the aromatic organic solvent is toluene, xylene, ethylbenzene, chlorobenzene, or dichlorobenzene.

7. a1) The ink composition according to claim 4, wherein the halogen organic solvent is chloroform, methylene chloride, or dichloroethane.

8. The ink composition according to claim 1, further comprising a film-forming material.

9. The ink composition according to claim 8, wherein the film-forming material is polymethyl methacrylate, polythiophene, polyphenylenevinylene, polystyrene, polycarbonate, or polyvinylcarbazole.

10. A film produced by forming a film by printing or coating the ink composition according to claim 1 and then drying the film.

11. The film according to claim 10, further comprising a film-forming material.

12. The film according to claim 11, wherein the film-forming material is polymethyl methacrylate, polythiophene, polyphenylenevinylene, polystyrene, polycarbonate, or polyvinylcarbazole.

13. An electronic element comprising the film according to claim 10.

14. A method for producing the ink composition according to claim 1, wherein the method comprises producing phthalocyanine nanowires comprising:
   (1) a step (a) of forming a complex by dissolving phthalocyanine and a phthalocyanine derivative in an acid and then precipitating the phthalocyanine and the phthalocyanine derivative in a poor solvent;
   (2) a step (b) of forming a size-reduced complex by reducing the size of the complex;
   (3) a step (c) of preparing a dispersion by dispersing the size-reduced complex in toluene, xylene, ethylbenzene, chlorobenzene, or dichlorobenzene; and
   (4) a step (d) of forming nanowires by heating the dispersion.

15. The method according to claim 14, wherein in the step (a), the acid is sulfuric acid, chlorosulfuric acid, methanesulfonic acid, or trifluoroacetic acid.

16. Phthalocyanine nanowires comprising phthalocyanine and a phthalocyanine derivative, characterized in that:
   1) the phthalocyanine is copper phthalocyanine, zinc phthalocyanine, or iron phthalocyanine;
   2) the phthalocyanine derivative is represented by general formula (1) or (2), or (3) described below; and
   3) the minor diameter of the phthalocyanine nanowires is 100 nm or less, and the ratio (length/minor diameter) of the length to the minor diameter is 10 or more;

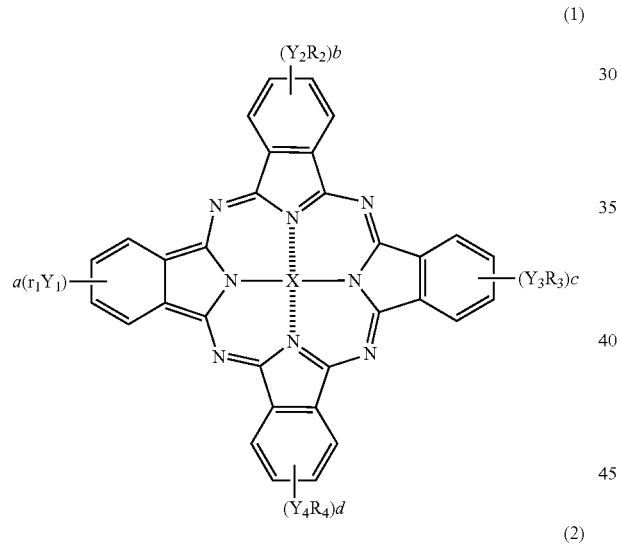

(1)

(2)

wherein in the formula (1) and (2), X is selected from the group consisting of a copper atom, a zinc atom, a cobalt atom, a nickel atom, a tin atom, a lead atom, a magnesium atom, a silicon atom, and an iron atom, and $Y_1$ to $Y_4$ represent linking groups which bond a phthalocyanine skeleton to $R_1$ to $R_4$, respectively;

when $Y_1$ to $Y_4$ each represent a bond as the linking group, $R_1$ to $R_4$ each represent $SO_3H$, $CO_2H$, an alkyl group which may be substituted, an (oligo)aryl group which may be substituted, an (oligo)heteroaryl group which may be substituted, a phthalimide group which may be substituted, or a fullerene which may be substituted;

when $Y_1$ to $Y_4$ are each a linking group represented by $-(CH_2)_n-$ wherein n represents an integer of 1 to 10, $-CH=CH-$, $-C\equiv C-$, $-O-$, $-NH-$, $-S-$, $-S(O)-$, or $-S(O)_2-$, $R_1$ to $R_4$ each represent an alkyl group which may be substituted, an (oligo)aryl group which may be substituted, an (oligo)heteroaryl group which may be substituted, a phthalimide group which may be substituted, or a fullerene which may be substituted; and a, b, c, and d each independently represent an integer of 0 to 2, but at least one of a, b, c, and d is 1;

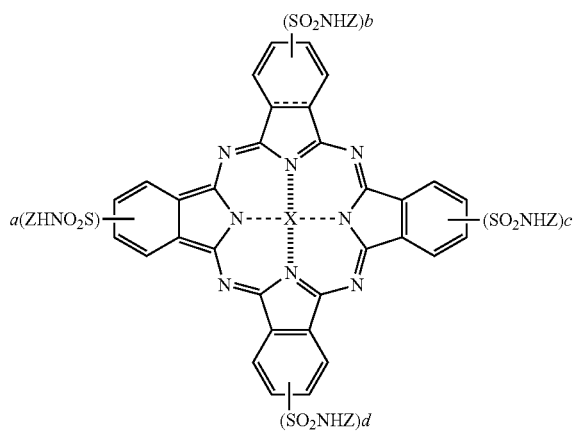

(3)

wherein in the formula (3), X is selected from the group consisting of a copper atom, a zinc atom, a cobalt atom, a nickel atom, a tin atom, a lead atom, a magnesium atom, a silicon atom, and an iron atom, Z is a group represented by a formula (a) or (b) described below, a, b, c, and d each independently represent an integer of 0 to 2 but at least one of a, b, c, and d is 1

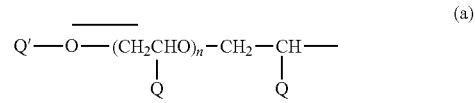

(a)

wherein n is and integer of 4 to 100, each Q is independently a hydrogen atom or a methyl group, and Q' is a noncyclic hydrocarbon group having 1 to 30 carbon atoms

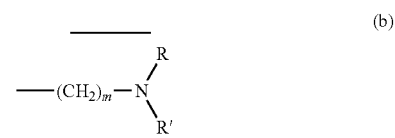

(b)

wherein m is an integer of 1 to 20, and R and R' are each independently an alkyl group having 1 to 20 carbon atoms.

17. The phthalocyanine nanowires according to claim 16, wherein in the general formula (1) or (2), the alkyl group which may be substituted is a methyl group, an ethyl group, or a propyl group, the (oligo)aryl group which may be substituted is an (oligo)phenylene group which may be substituted or an (oligo)naphthylene group which may be substituted, and the (oligo)heteroaryl group which may be substituted is an (oligo)pyrrole group which may be substituted, an (oligo)thiophene group which may be substituted, an (oligo)benzopyrrole group which may be substituted, or an (oligo)benzothiophene group which may be substituted.

* * * * *